(12) United States Patent
Kadota et al.

(10) Patent No.: US 10,838,563 B2
(45) Date of Patent: Nov. 17, 2020

(54) DISPLAY DEVICE AND DISPLAY DEVICE SUBSTRATE HAVING TOUCH SENSING FUNCTION

(71) Applicant: TOPPAN PRINTING CO., LTD., Taito-ku (JP)

(72) Inventors: Souhei Kadota, Taito-ku (JP); Kenzo Fukuyoshi, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 16/577,360

(22) Filed: Sep. 20, 2019

(65) Prior Publication Data

US 2020/0019264 A1 Jan. 16, 2020

Related U.S. Application Data

(63) Continuation of application No. PCT/JP2017/011177, filed on Mar. 21, 2017.

(51) Int. Cl.
*G06F 3/044* (2006.01)
*G06F 3/041* (2006.01)
(Continued)

(52) U.S. Cl.
CPC .......... *G06F 3/044* (2013.01); *G02F 1/13338* (2013.01); *G02F 1/133512* (2013.01);
(Continued)

(58) Field of Classification Search
CPC .......... G06F 3/041–3/047; H02J 50/00–50/90; H01Q 1/24; G02F 1/133512; H01L 51/5284

See application file for complete search history.

(56) References Cited

U.S. PATENT DOCUMENTS

2011/0156967 A1* 6/2011 Oh ............................ H01Q 1/24
343/702
2014/0176486 A1* 6/2014 Lee .......................... G06F 3/046
345/174
(Continued)

FOREIGN PATENT DOCUMENTS

JP 4915232 B2 4/2012
JP 2014/042248 A1 3/2014
(Continued)

OTHER PUBLICATIONS

International Search Report dated May 16, 2017 in PCT/JP2017/011177, filed Mar. 21, 2017 (with English Translation).

*Primary Examiner* — Laurence J Lee
(74) *Attorney, Agent, or Firm* — Oblon, McClelland, Maier & Neustadt, L.L.P.

(57) ABSTRACT

A display device including a display function layer between first and second substrates, respectively, a black matrix having an effective display region and a frame region, a first antenna unit for touch sensing, a second antenna unit for power, first and second conductive lines perpendicularly to one another, first active elements formed in the frame region, a third antenna unit for touch sensing, a fourth antenna unit for power, second active elements for driving the display function layer, and third and fourth conductive lines formed perpendicularly to one another. In a plan view from the first substrate toward the second substrate, the first and third antenna units overlap for transmitting or receiving a touch sensing signal, with a positional accuracy within ± 3 μm, and the second and fourth antenna units overlap for receiving a power signal, with a positional accuracy within ± 3 μm.

10 Claims, 11 Drawing Sheets

(51) Int. Cl.
*H01L 27/32* (2006.01)
*G02F 1/1333* (2006.01)
*G02F 1/1335* (2006.01)
*H01Q 1/24* (2006.01)

(52) U.S. Cl.
CPC .......... *G06F 3/0412* (2013.01); *G06F 3/0416* (2013.01); *H01L 27/323* (2013.01); *H01L 27/3244* (2013.01); *H01Q 1/24* (2013.01)

(56) References Cited

U.S. PATENT DOCUMENTS

2017/0153748 A1* 6/2017 Choi .................... H03K 17/962
2020/0067175 A1* 2/2020 Yamazaki ................ H01Q 7/00

FOREIGN PATENT DOCUMENTS

| JP | 5917748 B2 | 5/2016 |
| JP | 6016286 B2 | 10/2016 |
| JP | 6020571 B2 | 11/2016 |

* cited by examiner

DISPLAY DEVICE AND DISPLAY DEVICE SUBSTRATE HAVING TOUCH SENSING FUNCTION

CROSS-REFERENCE TO RELATED APPLICATIONS

The present application is a continuation of International Application No. PCT/JP2017/011177, filed Mar. 21, 2017, the entire content of which is incorporated herein by reference.

BACKGROUND OF THE INVENTION

Field of the Invention

The present invention relates to a display device and a display device substrate.

Discussion of the Background

Display devices that allow direct finger or pointer input on a display screen, such as smartphones or tablets having a capacitive touch sensing function, are common. Known touch sensing functions use an on-cell system or an in-cell system. In the former system, a touch panel is attached onto the surface of a liquid crystal, an organic EL (organic electroluminescence) or other display, while in the latter system, a liquid crystal or organic EL display device has a built-in touch sensing function. In recent years, there has been a shift from the on-cell method to the in-cell method.

PTL 1 discloses a typical in-cell system technique. As described in claim 1 of PTL 1, a conductive path is formed across a specific region (third region) so as to electrically bypass a circuit element in the region, and a first line segment and a second line segment used in a touch screen are electrically connected. Such a highly complicated configuration is introduced in PTL 1.

This is because the transistors are arranged in a matrix, and a plurality of gate lines and source lines for driving the transistors are provided on a surface of a substrate on which a touch screen is formed. Part of the lines for the touch screen therefore need to avoid electrical contact with the gate lines and source lines with a bypass line structure.

In addition, there is a concern with conventional in-cell techniques that form part of the touch lines on a surface on which thin film transistors for driving liquid crystals and the like are formed; an unexpected parasitic capacitance may possibly occur around the touch lines, which may result in a lower touch sensing S/N ratio. In other word, the parasitic capacitance is liable to occur between gate lines and source lines that extend in the X direction and the Y direction on the surface for the transistor and touch lines that extend almost in parallel to the X direction and the Y direction.

The parasitic capacitance causes the S/N ratio to decrease as described above, which makes it hard to provide sufficient touch sensing resolution. This in turn makes it hard, for example, to distinguish between a "finger", which has a large touch sensing area, and a pen, which has a small touch sensing area. In addition, since the conventional in-cell technique fails to provide sufficient resolution, there is a problem that it is hard to apply a touch screen to a personal authentication technique such as fingerprint authentication. Therefore, there is a need for separately providing a device specifically designed for fingerprint authentication and a display screen.

To reduce the parasitic capacitance between the touch lines, and the gate lines and source lines for driving a transistor, a space is preferably provided between a surface on which a first touch sensing unit and a second touch sensing unit are formed and a surface on which the gate lines and source lines are formed. PTL 2 discloses a configuration in which such a space is provided. As shown in FIG. 12 and FIG. 13 of PTL 2, a display substrate 22 with a touch sensing function and an array substrate 23 including a thin film transistor are spatially separated from each other by a liquid crystal layer 24. PTL 2 also discloses a technique for forming a metal layer pattern that serves as a touch line by use of an alloy layer whose main material is copper.

In the configuration disclosed in PTL 2, a terminal portion 61 of a plurality of metal layer patterns (corresponding to the first touch sensing lines) provided on the display substrate 22 and a terminal portion of a plurality of transparent electrode patterns (corresponding to the second touch sensing lines) provided on the display substrate 22 are connected to a connector located on a liquid crystal sealing portion of an array substrate. The liquid crystal sealing portion of the array substrate is, however, manufactured so as to produce a narrow frame in favor of enlargement of an effective display region. Therefore, it is quite difficult to establish electrical connection between terminal portions of the metal layer pattern and the transparent electrode pattern, and the liquid crystal sealing portion.

When conductive particles such as metal balls and gold beads are used to electrically connect the terminal portions to connectors of the liquid crystal sealing portion of the array substrate, it is difficult to electrically connect the several hundreds or thousands of minute terminal portions to the connection terminals of the liquid crystal sealing portion uniformly in a thickness direction thereof. Extending the substrate to use an FPC or other flexible circuit board can provide electrical connection only on the side where the terminal portion of the display device is present, but such a conductive structure fails to provide a narrow frame. In recent years, the width of a light-shielding frame region provided around the effective display area of the display device is required to be as narrow as 5 mm or less.

In order to achieve touch input by a pen or fingerprint authentication in addition to touch input by a finger, a structure in which, for example, the wiring density of a plurality of touch wirings extending in the X direction and the Y direction is increased is required. In this case, the number of pixels is required to be similar to that of a high-definition liquid crystal display device, for example 2100×3800 pixels. In order to achieve a touch screen capable of touch input using a pen as described above, a structure in which the wiring density of a plurality of touch wirings extending in the X direction and the Y direction is increased is required. In addition, a structure applicable to the narrow framing structure described above is also required.

PTL 3 discloses a configuration in which a first substrate, which is a flexible substrate, has a first antenna, a third substrate, which is also a flexible substrate, has a second antenna, and the first antenna and the second antenna overlap with each other via the third substrate. The first substrate and a second substrate each have a configuration in which a liquid crystal is sandwiched between a pixel unit and a counter electrode. PTL 3 does not disclose that the display device has a touch sensing function on the first substrate, nor does it disclose adverse effects, such as the occurrence of parasitic capacitance when the source lines and the gate lines are brought close to the touch sensing lines, and a decline in S/N ratio associated with touch sensing.

PTL 4 discloses a loop coil that detects the coordinate location of an object that approaches a panel, the loop coil being arranged on an outer periphery of the panel, and a sensor matrix that detects the coordinate location of the object. PTLs 3 and 4 do not disclose a technique for supplying a signal involved in touch sensing or for powering a touch sensing function unit with an antenna unit that fits within the frame region, a triple-layered conductive wiring technique in which conductive metal oxide layers sandwich a copper alloy layer, or a configuration in which the first touch sensing line unit and the second touch sensing line unit are disposed on only one surface of the first substrate (counter substrate) of the whole surface of the display device, either.

PTL 5 discloses a technique for forming a touch panel driving circuit 250 with a TFT circuit of an oxide semiconductor on one surface of a substrate 210. Paragraphs [0070] and [0071] of PTL 5 disclose, as Example 3, an in-cell touch panel in which a color filter substrate on which a group of electrodes constituting the touch panel and the touch panel driving circuit 250 are formed, and additionally a counter electrode 260 is laminated.

However, PTL 5 does not set forth how to supply a touch driving voltage or power to the touch panel or the touch panel driving circuit, or which route a touch position detection signal passes through and where the actual detection of the touch position is processed, either. Paragraphs [0074] to [0077] of PTL 5 disclose, as Example 4, an example in which a touch panel driving circuit 250 is formed on a TFT glass substrate 310. Paragraph [0077] of Example 5 of PTL 5 describes that mixing gold beads and the like into a sealing material can make an electrical connection (provide conduction) between a CF glass substrate 215 and the TFT glass substrate 310.

The paragraph, however, does not set forth whether mixing gold beads and the like into a sealing material enables stable provision of conduction using a large number of touch lines in a dense touch line structure that achieves pen input as described above. PTL 5 does not disclose a technique for supplying a signal involved in touch sensing or for powering a touch sensing function unit with an antenna unit that fits within the width of the frame region, or a triple-layered conductive wiring technique in which conductive metal oxide layers sandwich a copper alloy layer, either.

PTL 1 JP 6016286 B
PTL 2 JP 6020571 B
PTL 3 JP 5917748 B
PTL 4 JP 4915232 B
PTL 5 WO 2014/042248

SUMMARY OF THE INVENTION

According to an aspect of the present invention, a display device includes a first substrate having a first surface, a second substrate having a second surface facing the first surface, a display function layer formed between the first substrate and the second substrate, a black matrix formed on the first surface and having an effective display region and a frame region surrounding the effective display region; a first antenna unit formed in the frame region for touch sensing; a second antenna unit formed in the frame region for power; first conductive lines formed in the effective display region such that a part of the first conductive lines forms a first touch sensing line unit including fifth conductive lines parallel to one another, the first conductive lines, the first and second antenna units, and the first touch sensing line unit being located on the same layer and each including a triple-layered conductive layer including a copper or copper alloy layer sandwiched between conductive metal oxide layers in a thickness direction of the first substrate; second conductive lines formed perpendicularly to the first conductive lines such that a part of the second conductive lines forms a second touch sensing line unit including sixth conductive lines parallel to one another, the second conductive lines each covering the triple-layered conductive layer forming the first conductive line via a first-substrate-side insulating layer, and including a triple-layered conductive layer including a copper or copper alloy layer sandwiched between conductive metal oxide layers, first active elements formed in the frame region such that the first active elements, the fifth conductive lines, and the sixth conductive lines form a circuit for controlling touch sensing, a third antenna unit formed on the second surface for touch sensing, a fourth antenna unit formed on the second surface for power, second active elements for driving the display function layer, third conductive lines formed on the second surface, the third conductive lines and the third and fourth antenna units being located on the same layer and each including a triple-layered conductive layer including a copper or copper alloy layer sandwiched between conductive metal oxide layers in a thickness direction of the second substrate, and fourth conductive lines formed perpendicularly to the third conductive lines, the fourth conductive lines each covering the triple-layered conductive layer forming the third conductive lines via a second-substrate-side insulating layer, and including a triple-layered conductive layer including a copper or copper alloy layer sandwiched between conductive metal oxide layers. Each of the first and second antenna units has at least one loop antenna including a connection pad connected to a part of the second conductive lines via a through-hole formed in the first-substrate-side insulating layer. Each of the third and fourth antenna units has at least one loop antenna including a connection pad connected to a part of the fourth conductive lines via a through-hole formed in the second-substrate-side insulating layer. In a plan view from the first substrate toward the second substrate, the first and third antenna units overlap for transmitting or receiving a touch sensing signal, with a positional accuracy within ± 3 μm in a portion where the loop antenna is formed, and the second and fourth antenna units overlap for receiving a power signal, with a positional accuracy within ± 3 μm in a portion where the loop antenna is formed.

According to another aspect of the present invention, a display device substrate, including a substrate having a first surface, a black matrix formed on the first surface and having an effective display region and a frame region surrounding the effective display region, a first antenna unit formed in the frame region, a second antenna unit formed in the frame region, first conductive lines formed in the effective display region such that a part of the first conductive lines forms a first touch sensing line unit including fifth conductive lines parallel to one another, the first conductive lines, the first and second antenna units, and the first touch sensing line unit being located on the same layer and each including a triple-layered conductive layer including a copper or copper alloy layer sandwiched between conductive metal oxide layers in a thickness direction of the first substrate, second conductive lines formed perpendicularly to the first conductive lines such that a part of the second conductive lines forms a second touch sensing line unit including sixth conductive lines parallel to one another, the second conductive lines each covering the triple-layered conductive layer forming the first conductive line via an insulating layer, and including a triple-layered conductive layer including a copper or copper alloy layer sandwiched between conductive metal oxide layers, and a transparent resin layer covering the effective display region on the first surface. Each of the first and second antenna units has at least one loop antenna including a connection pad connected to a part of the second conductive lines via a through-hole formed in the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
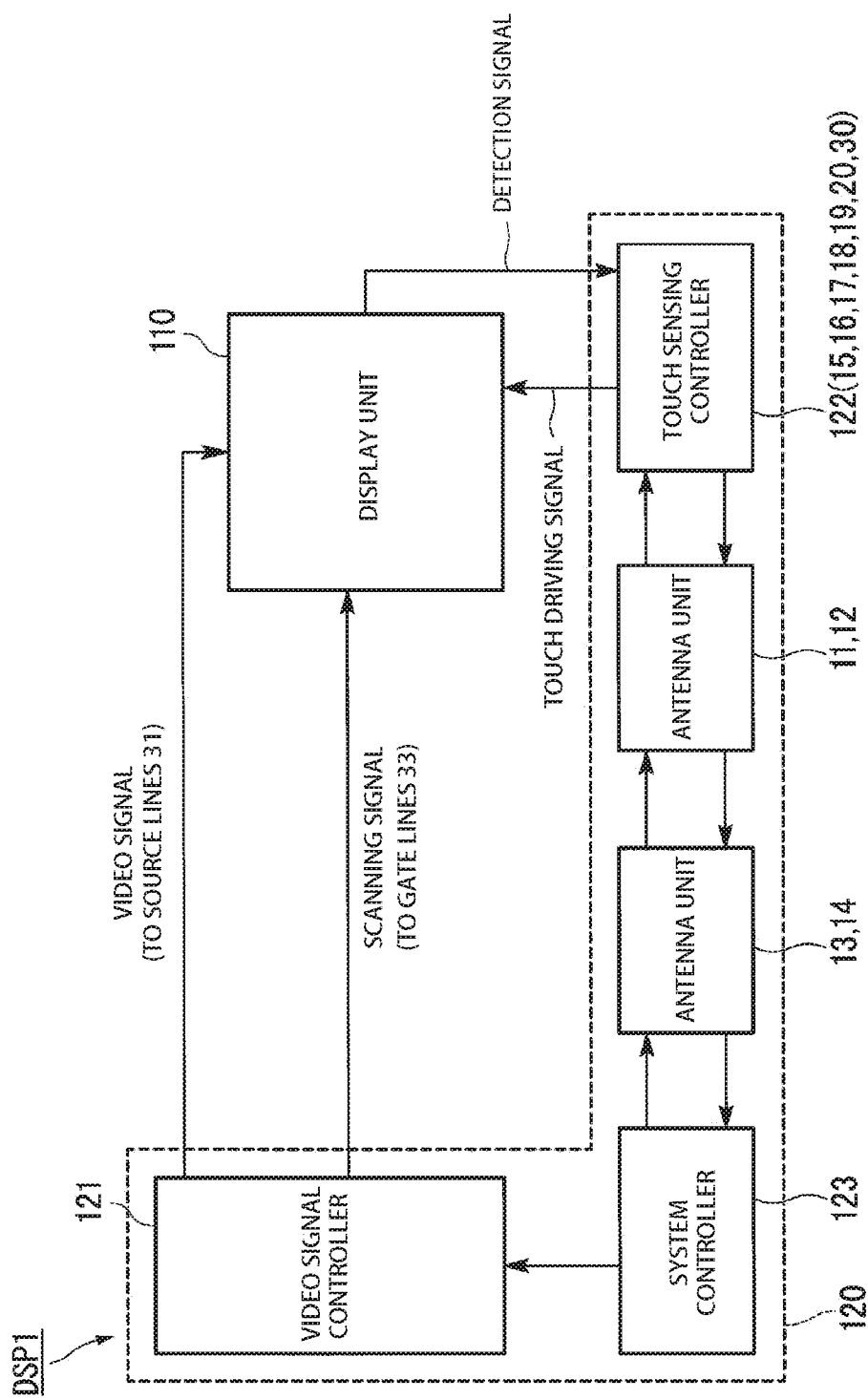
FIG. 1 is a block diagram of a control unit (video signal controller, system controller, and touch sensing controller) and a display unit constituting a display device according to a first embodiment of the present invention.

With reference to the drawings, a description will be given of embodiments of the present invention.

In the following description, identical or substantially identical functions and components are indicated by identical reference signs to omit or simplify description, or description will be given only when necessary. In the drawings, in order to make the constituent members be of an understandable size in the drawings the dimensions and the proportions of the constituent members are modified as needed. In addition, components difficult to illustrate are omitted as necessary, such as an insulating layer constituting a liquid crystal display device, a buffer layer, a plurality of layers that form a channel layer of a semiconductor, and a plurality of layers that form a conductive layer, an alignment film for initially aligning the liquid crystal layer, an optical film such as a polarizing film and an optical retardation film, a protective cover glass, and a backlight.

Examples of a substrate for a first substrate and second substrate according to an embodiment of the present invention include a glass substrate, a ceramic substrate, a quartz substrate, a sapphire substrate, a semiconductor substrate such as silicon, silicon carbide, or silicon germanium, and a plastic substrate.

For example, a visible transparent substrate such as a glass substrate can be used as the first substrate and a silicon substrate and the like can be used as the second substrate to constitute a reflective display device.

The ordinal numbers "first" and "second" used in the first substrate and the second substrate, ordinal numbers such as "first" to "sixth" used in the first conductive line to the sixth conductive lines, ordinal numbers such as "first" to "eighth" used in the first conductive metal oxide layer to the eighth conductive metal oxide layer, are given to avoid confusion of components, and do not limit the quantity thereof. The first conductive line to the sixth conductive lines may be simply referred to as conductive line(s) in the following description. The first conductive metal oxide layer to the eighth conductive metal oxide layer may be each simply referred to as conductive metal oxide layer(s) in the following description.

A display device according to an embodiment of the present invention can have a capacitive touch sensing function. As described later, conductive lines such as the first conductive line and the second conductive line can be used as a touch sensing detection line and a touch sensing driving line. In the following description, conductive lines, electrodes, and signals that are involved in touch sensing may be simply referred to as touch lines, touch driving lines, touch detection lines, touch electrodes, and touch driving signals, respectively. A voltage applied to touch sensing lines for touch sensing driving is referred to as a touch driving voltage, while a voltage applied across common electrodes and pixel electrodes to drive a liquid crystal layer, which serves as a display function layer, is referred to as a liquid crystal driving voltage. A voltage at which to drive an organic EL layer is referred to as an organic EL driving voltage. Conductive lines connected to a common electrode may be referred to as common lines. A display function layer according to an embodiment of the present invention may employ a light-emitting element referred to as a micro LED.

First Embodiment (Functional Structure of a Display Device DSP1)

With reference to FIGS. 1 to 11, a liquid crystal display device DSP1 according to a first embodiment of the present invention will now be described.

The embodiments below describe only characteristic parts of a display device, and omit description of parts that are not different from components used, for example, in generally used liquid crystal display devices.

In the display device DSP1 according to the embodiments of the present invention, the display function layer is a liquid crystal layer, and the second active element is a thin film transistor (TFT), which drives the liquid crystal layer.

The display devices according to the embodiments of the present invention use an in-cell system. The in-cell system refers to a display device into which a touch sensing function is incorporated, or a display device with which a touch sensing function is integrated. In a liquid crystal display device in which a display device substrate and an array substrate (TFT substrate) are bonded together via a liquid crystal layer, a polarizing film is attached to an outer surface of each of the display device substrate and the array substrate. In other words, the in-cell liquid crystal display device according to the embodiments of the present invention is a liquid crystal display device having a touch sensing function at any part positioned between the two mutually opposed polarizing films and constituting the liquid crystal display device in the thickness direction. The technical term "touch sensing" used in the present invention may be on occasions referred to simply as "touch" when the term is used as an adjective.

FIG. 1 is a block diagram illustrating a display device DSP1 according to the first embodiment of the present invention. As shown in FIG. 1, the display device DSP1 according to the present embodiment includes a display unit 110, and a control unit 120 for controlling the display unit 110 and the touch sensing function.

The control unit 120 has a known configuration and includes a video signal controller 121 (first control unit), a touch sensing controller 122 (second control unit), and a system controller 123 (third control unit). Antenna units 11 to 14 are provided between the touch sensing controller 122 and the system controller 123.

The video signal controller 121 maintains common electrodes provided on an array substrate 200 at a constant potential, and transmits a signal to a gate line 33 (described later, a scanning line) provided on the array substrate 200 and to a source line 31 (described later, a signal line). When the video signal controller 121 applies a liquid crystal display driving voltage across the common electrodes and pixel electrodes 49 (described later), electric fields are created on the array substrate 200, and liquid crystal molecules are rotated to be parallel to the electric fields, thereby driving the liquid crystal layer 4. An image is thus displayed on the array substrate 200. A rectangular wave video signal, for example, is individually applied to the plurality of pixel electrodes 49 via the source lines (signal lines). The rectangular waves may be positive or negative DC or AC rectangular waves. The video signal controller 121 sends such a video signal to a source line.

The touch sensing controller 122 applies a touch sensing driving voltage to touch sensing driving lines, and detects a change in capacitance that occurs between the touch sensing driving lines and the touch sensing detection lines for touch sensing operation. The touch sensing controller 122 includes a power receiver 15, a power supply controller 16, a touch driving controller 17, a touch driving switching circuit 18, a touch detection switching circuit 19, a touch signal transmission or reception controller 20, and a detection and AD conversion unit 30, all of which will be described later.

The system controller 123 can control the video signal controller 121 and the touch sensing controller 122 to perform liquid crystal driving and capacitance change detection alternately, or in a time-sharing manner. The system controller 123 may also have a function of differentiating a liquid crystal driving frequency and a touch sensing driving frequency or driving a liquid crystal at different voltages.

The system controller 123 having such a function may detect, for example, a frequency of noise from the external environment, which is picked up by the display device DSP1, to select a touch sensing driving frequency different from the noise frequency, thereby alleviating the influence of noise. In addition, a touch sensing driving frequency can be selected in accordance with a scanning speed of a pointer such as a finger and a pen for the system controller 123.

In the liquid crystal display device DSP1 configured as shown in FIG. 1, the control unit 120 has a function of applying a liquid crystal display driving voltage across the pixel electrodes 49 to drive liquid crystals, and a touch sensing function of detecting a change in capacitance that occurs between the touch sensing driving lines and the touch sensing detection lines. The touch sensing lines according to the embodiments of the present invention is formed of a highly conductive metal layer, so that the electrical resistance of the touch sensing lines becomes lower, to improve touch sensitivity (described later).

The control unit 120 preferably has a function of performing touch sensing driving during at least one of a stable image display period and a stable black mode period following the image display.

(Structure of Display Device DSP1)

The liquid crystal display device of the present embodiment may include a display device substrate according to an embodiment described later. The term "plan view" set forth below refers to a plane as viewed perpendicularly from the first substrate toward the second substrate, that is, viewed in a direction in which an observer observes a display surface of the liquid crystal display device (plane of the display device substrate). In the embodiments of the present invention, there is no limitation to the shape of the display unit of the liquid crystal display device, the shape of the pixel aperture that defines a pixel, and the number of pixels constituting the liquid crystal display device. In the embodiments detailed below, however, the liquid crystal display device will be described, defining, in plan view, the direction of the shorter side of the pixel aperture as being an X direction, the direction of the longer side (longitudinal direction) thereof as being a Y direction, and the thickness direction of the transparent substrate as being a Z direction. In the following embodiments, the liquid crystal display device may be configured with the X and Y directions defined above being switched with each other.

Figure 2:
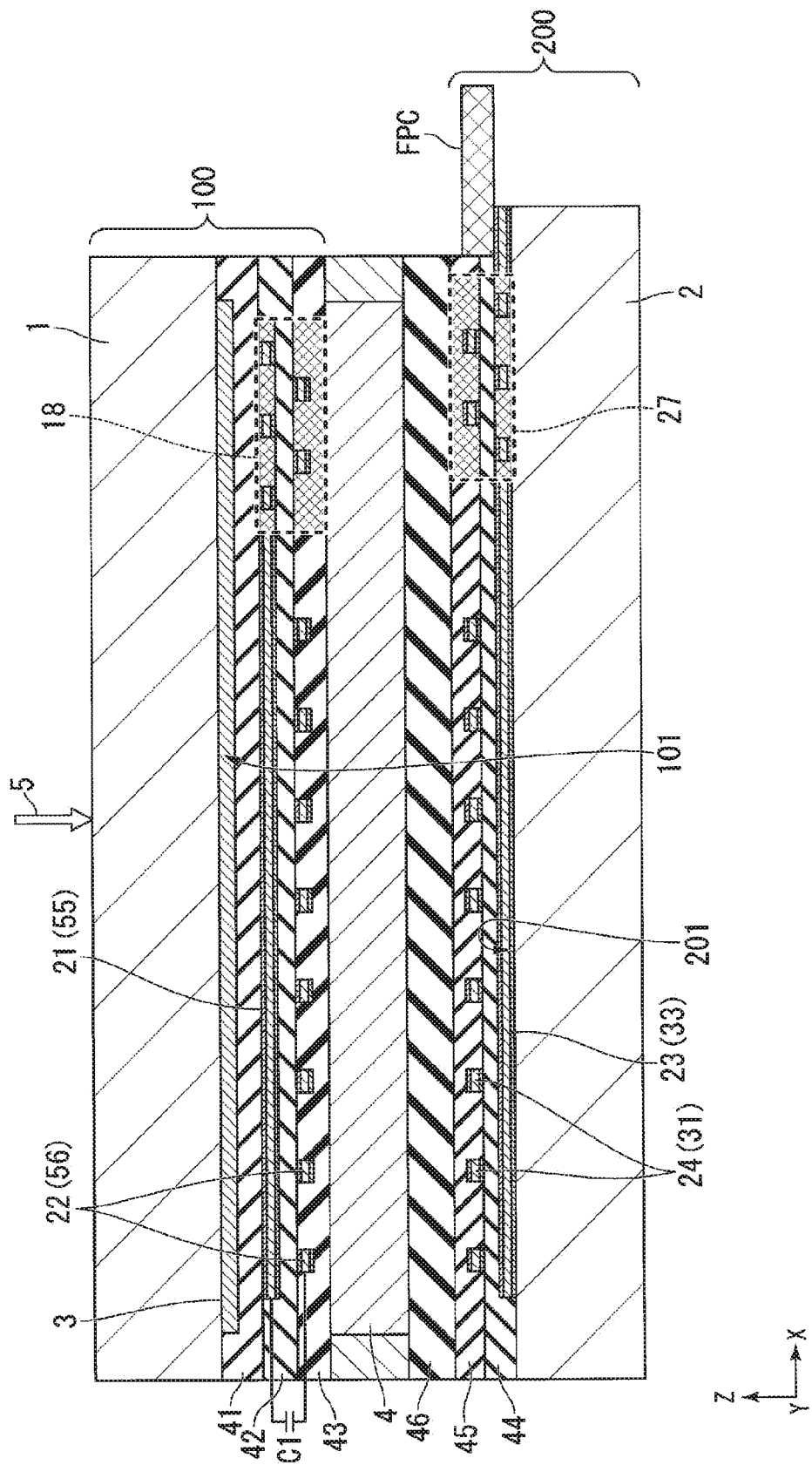
FIG. 2 is a cross-sectional view illustrating part of a display device according to the first embodiment of the present invention.

FIG. 2 is a cross-sectional view illustrating part of a display device according to a first embodiment of the present invention.

The display device DSP1 includes a display device substrate 100 (first substrate) including a first transparent substrate 1 having a first surface 101, an array substrate 200 (second substrate) including a second transparent substrate 2 having a second surface 201 facing the first surface 101, and a liquid crystal layer 4 (display function layer) disposed between the first transparent substrate 1 and the second transparent substrate 2. In other words, the display device DSP1 has a structure in which the display device substrate 100 and the array substrate 200 are bonded together via the liquid crystal layer 4 so as to face each other.

On the display device substrate 100, at least a black matrix 3, a lower insulating layer 41, a first conductive line 21, a first-substrate-side insulating layer 42 (gate insulating layer), a second conductive line 22, and a upper insulating layer 43 (transparent resin layer) are laminated on the first surface 101 of the first transparent substrate 1. A touch driving switching circuit 18, which will be described later, is provided at the outer periphery of the first transparent substrate 1. In the display device substrate 100, a plurality of fifth conductive lines 55 constituting a first touch sensing line unit and a plurality of sixth conductive lines 56 constituting a second touch sensing line unit are provided. On the first surface 101 on which the first conductive line 21, the first antenna unit 11, the second conductive line 22, and the second antenna unit 12 are formed, an effective display region 71 is covered with the upper insulating layer 43.

The fifth conductive lines 55 formed on the first transparent substrate 1 are lines in which part of the first conductive lines 21 serve as touch sensing lines. The sixth conductive lines 56 formed on the first transparent substrate 1 are lines in which part of the second conductive lines 22 serve as touch sensing lines. A plurality of parallel fifth conductive lines 55 are referred to as a first touch sensing line unit, and a plurality of parallel sixth conductive lines 56 are referred to as a second touch sensing line unit.

The term "first touch sensing line unit" in the present invention refers to a plurality of conductive lines extending in parallel in the first direction. The term "second touch sensing line unit" in the present invention refers to a plurality of conductive lines extending in parallel in the second direction perpendicular to the first direction. The first touch sensing line unit and the second touch sensing line unit are used for touch sensing to detect the position of a finger or other pointer on a basis of a change in capacitance.

In the effective display region 71, the plurality of fifth conductive lines 55 (first touch sensing lines) are parallel to each other and extend in the X direction (first direction), while a plurality of sixth conductive lines 56 (second touch sensing lines) are parallel to each other and extend in the Y direction (second direction) perpendicular to the X direction. A capacitance C1 associated with touch sensing occurs between the fifth conductive lines 55 and the sixth conductive lines 56. Presence or absence of a touch, and the touch location, are detected on a basis of a change in the capacitance C1. The touch lines are preferably grounded to the housing of the display device after touch detection or after touch driving at a certain cycle to reset the capacitance associated with the touch.

Figure 11:
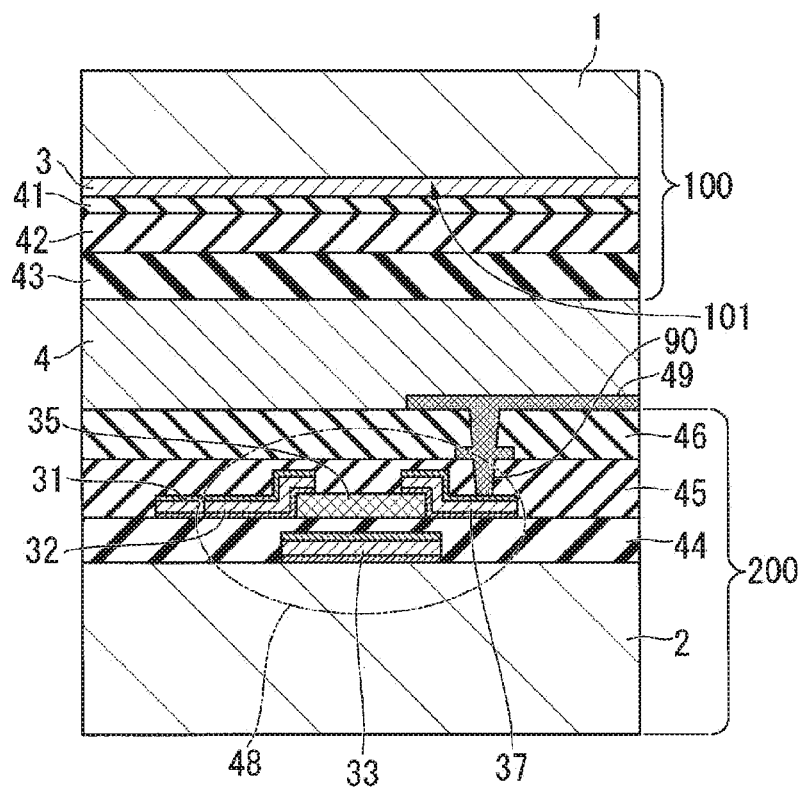
FIG. 11 is a cross-sectional view illustrating part of an active element formed on an array substrate constituting a display device according to a first embodiment of the present invention.

In the array substrate 200, a gate line 33 (gate electrode, third conductive line 23), a second-substrate-side insulating layer 44 (gate insulating layer), a source line 31 (fourth conductive line 24) and insulating layers 45 and 46 and the like are laminated on a second surface 201 of the second transparent substrate 2 (see FIG. 11). A gate signal switching circuit 27, which will be described later, is provided at the outer periphery of the second transparent substrate 2. An FPC is provided at an outer side of the array substrate 200. A CPU (control unit 120, see FIG. 1, not shown in FIG. 2) that controls the entire display device including touch sensing and a battery that powers the display device are connected to the FPC. The display device substrate 100 and the array substrate 200 are bonded together via the liquid crystal layer 4 and the alignment film (not shown).

(Display Device Substrate 100)

Figure 3:
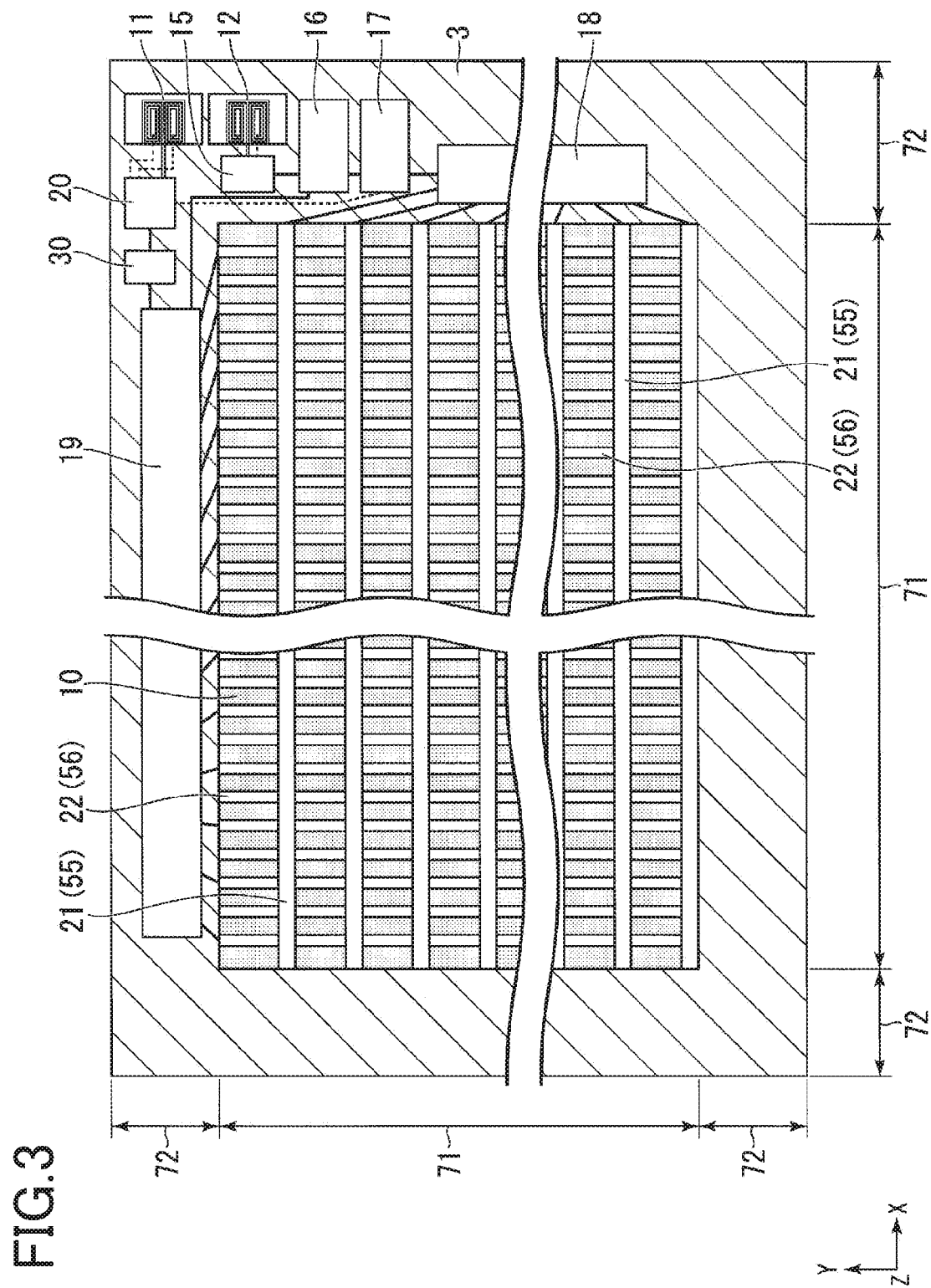
FIG. 3 is a plan view of a circuit, including a first conductive line, a second conductive line, a first antenna unit, a second antenna unit, a control unit, that is formed on a display device substrate constituting a display device according to a first embodiment of the present invention.

FIG. 3 is a plan view of a display device substrate 100 constituting a display device according to a first embodiment of the present invention. FIG. 3 shows a plan view of the display device substrate 100 as viewed from an observer, but illustrates components of the display device substrate 100 such that a light-shielding black matrix 3 can be seen through.

As shown in FIG. 3, a black matrix 3, first conductive lines 21, second conductive lines 22, a first antenna unit 11, a second antenna unit 12, an power receiver 15, a power supply controller 16, a touch driving controller 17, a touch driving switching circuit 18, a touch detection switching circuit 19, a touch signal transmission or reception controller 20 and a wave detection and AD conversion unit 30 are provided on the first surface 101 of the first transparent substrate 1 in the display device substrate 100. Part of the first conductive lines 21 and part of the second conductive lines 22 are used as lead lines that electrically connect a circuit such as the first antenna unit 11, the second antenna unit 12, the touch driving switching circuit 18, and the touch detection switching circuit 19. The black matrix 3 has a rectangular effective display region 71 and a frame region 72 that encloses the effective display region 71. As shown in FIG. 3, the power receiver 15, the power supply controller 16, the touch driving controller 17, the touch driving switching circuit 18, the touch detection switching circuit 19, the touch signal transmission or reception controller 20, the wave detection and AD conversion unit 30 are each a "circuit for controlling touch sensing" of the present invention. Part of the first conductive lines 21, part of the second conductive lines 22, and the first active elements constitute a circuit for controlling touch sensing. The power receiver 15 smoothes a received voltage and outputs a constant voltage to the power supply controller 16 as a touch driving voltage.

The first conductive lines 21, the second conductive lines 22, the first antenna unit 11, the second antenna unit 12, the touch signal transmission or reception controller 20, the touch driving switching circuit 18, and the touch detection switching circuit 19 need not necessarily be disposed on the black matrix 3. In this case, the first conductive lines 21 and the second conductive lines 22 are formed as touch sensing lines on the black matrix 3 in the effective display region, while the touch signal transmission or reception controller 20, the touch driving switching circuit 18, the touch detection switching circuit 19, and the like can be formed on the glass surface (first surface 101 on the first substrate) outside the frame on which the black matrix 3 is not formed, for example. Part of the first conductive lines 21 and the second conductive lines 22 can be used as double-layered conductive lines of the first antenna unit 11 and the second antenna unit 12 via the lower insulating layer 41. The first antenna unit 11 and the second antenna unit 12 include a pair of loop antennas each of which is wound twice or more in a direction opposite to the other.

The black matrix 3 can be formed, for example, of a colored resin in which a black colorant is dispersed. The black matrix 3 can also be formed of a low-reflectivity metal oxide or metal oxynitride. The black colorant may be carbon, carbon nanotube, carbon nanohorn, or a mixture of a plurality of organic pigments. For example, carbon may be used at a ratio of 51 mass % or more relative to the total amount of colorants, that is, used as a main colorant. Blue, red, or other organic pigments may be added to the black colorant to adjust the reflected color. For example, carbon concentration in a photosensitive black coating liquid as a starting material may be adjusted (carbon concentration may be lowered) to obtain a neutral black and low reflectance. Such a process can lower visible light reflectivity at an interface between the black matrix 3 and the first transparent substrate 1, such as a sheet of glass, to approximately 3% or less, which in turn achieves high visibility.

(Array Substrate 200)

Figure 4:
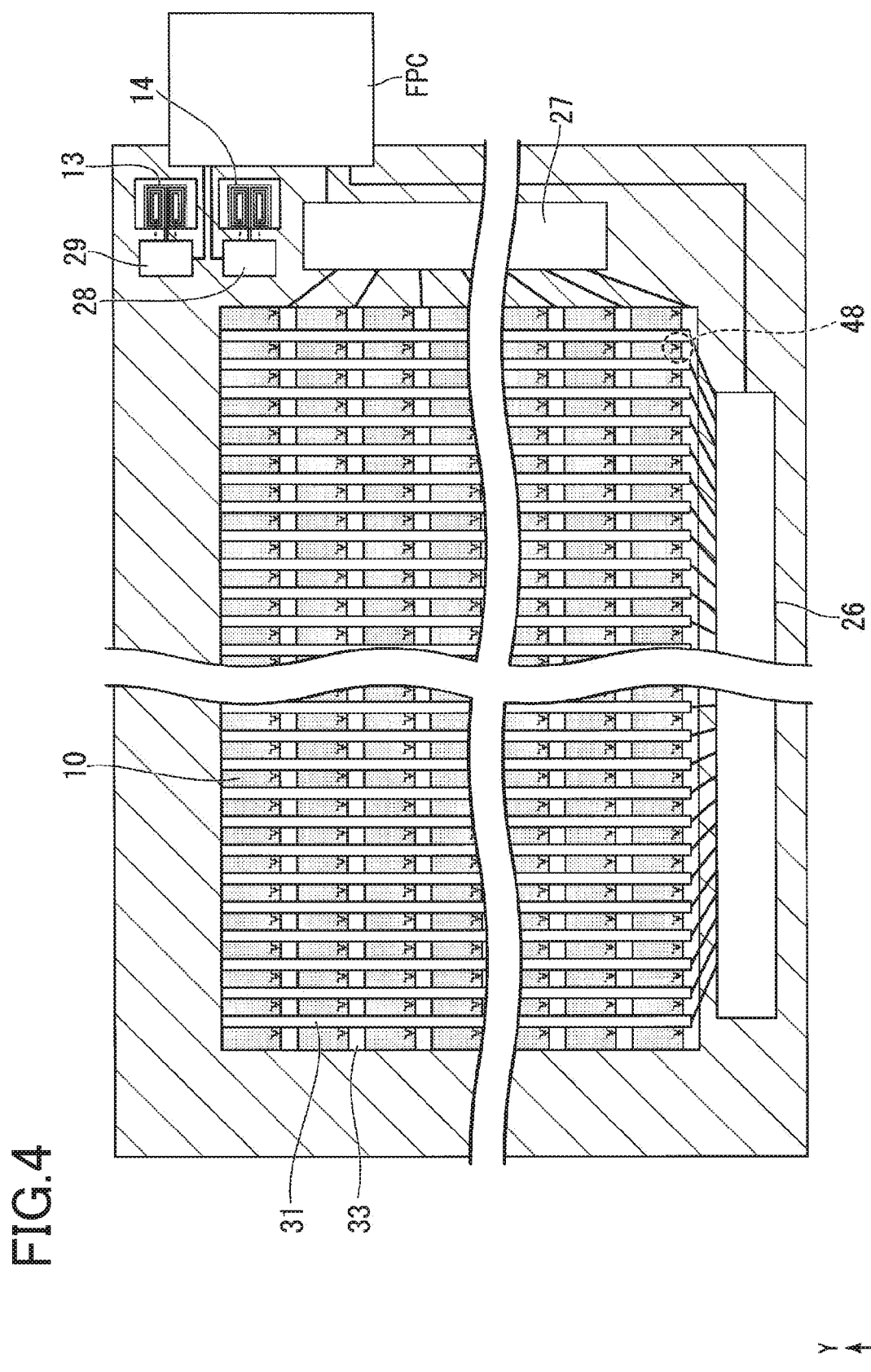
FIG. 4 is a plan view of a circuit, including a third antenna unit, a fourth antenna unit, a source signal switching circuit, a gate signal switching circuit, that is formed on an array substrate constituting a display device according to a first embodiment of the present invention.

FIG. 4 is a plan view of an array substrate 200 constituting a display device according to a first embodiment of the present invention.

As shown in FIG. 4, a third antenna unit 13, a fourth antenna unit 14, a source signal switching circuit 26, a gate signal switching circuit 27, an power transmission unit 28, a signal transceiver 29, and other circuits as well as an FPC are provided on the second surface 201 of the second transparent substrate 2 in the array substrate 200. A thin film transistor is provided at a position corresponding to a pixel aperture 10 in the array substrate 200. The third antenna unit 13 and the fourth antenna unit 14 include a pair of loop antennas each of which is wound twice or more in a direction opposite to the other.

The first antenna unit 11 and the third antenna unit 13 are arranged so as to overlap each other in plan view (first overlapping portion 51) when the display device substrate 100 and the array substrate 200 are bonded together. The second antenna unit 12 and the fourth antenna unit 14 are also arranged so as to overlap each other in plan view (second overlapping portion 52). The first overlapping portion 51 has a function of transmitting and receiving a touch sensing signals, while the second overlapping portion 52 has a function of receiving a power signal. The first antenna unit 11 and the third antenna unit 13, which form the first overlapping portion 51, and the second antenna unit 12 and the fourth antenna unit 14, which form the second overlapping portion 52, are arranged in the frame region 72.

(Conductive Lines)

Next, a description will be given of a structure of the first conductive lines 21, the second conductive lines 22, the fifth conductive lines 55 and the sixth conductive lines 56, which are described above, as well as the third conductive line 23 and the fourth conductive line 24, all of which will be discussed later. The first conductive lines 21 will represent these conductive lines for description of the structure thereof. The structure and constituent materials of the first conductive lines 21 can be applied to the second conductive lines 22, the third conductive lines 23, the fourth conductive lines 24, the fifth conductive lines 55, and the sixth conductive lines 56.

Figure 5:
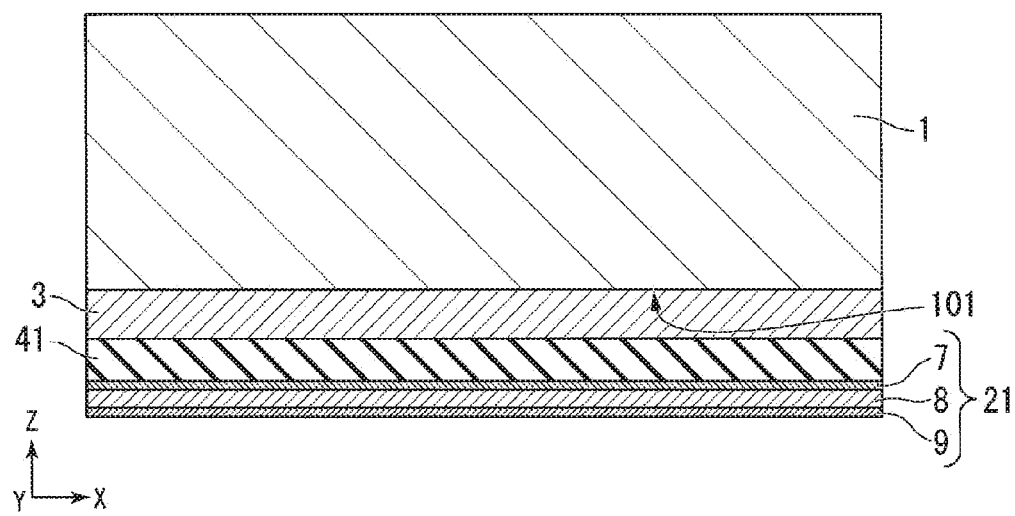
FIG. 5 is a cross-sectional view of a first conductive line formed on a first surface of a display device substrate constituting a display device according to the first embodiment of the present invention.

As shown in FIG. 5, a black matrix 3 is formed on the first transparent substrate 1, a lower insulating layer 41 is formed on the black matrix 3, and the first conductive lines 21 are formed on the lower insulating layer 41. The first conductive lines 21 have a configuration in which a copper alloy layer 8 (or copper layer) is sandwiched between a first conductive metal oxide layer 7 and a second conductive metal oxide layer 9. The thickness of the first conductive metal oxide layer 7 and the second conductive metal oxide layer 9 may be selected from the range of, for example, 10 nm to 100 nm thick each. The thickness of the copper alloy layer 8 may be selected from the range of, for example, 50 nm to 500 nm.

The method of forming the conductive metal oxide layers 7, 9 and the copper alloy layer 8 is preferably sputtering or other vacuum film formation methods. If a plating method is used in combination to form the copper alloy layer 8, the copper alloy layer 8 may be formed thicker than the film thickness described above.

Such a line structure can be applied not only to the first conductive lines 21 formed on the first transparent substrate 1 but also to various lines formed on the second transparent substrate 2. The line structure described above can also be applied to the gate lines 33, which correspond to the third conductive lines 23 (see FIGS. 2 and 11), the source lines 31, which correspond to the fourth conductive lines 24 (see FIGS. 2 and 11), or common lines (not shown). An illustrative line structure that can be applied is one in which a copper alloy layer having the same composition as the copper alloy layer 8 described above is sandwiched between metal oxide layers formed of the same material as the first conductive metal oxide layer 7 and the second conductive metal oxide layer 9.

The copper alloy layer 8 will be specifically described.

The copper alloy layer 8 includes a first element that forms a solid solution with copper and a second element that is less electronegative than copper and the first element. The first and second elements increase the specific resistance of the copper alloy layer by 1 µΩcm/at % or less when added to copper. The copper alloy layer has a specific resistance in the range of 1.9 µΩcm to 6 µΩcm. The element that forms a solid solution with copper in the present embodiment can be rephrased as an element that substitutionally forms a solid solution with copper in the temperature range from −40° C. to +80° C., which is a temperature range for electronic devices including vehicle-mounted electronic devices. The element(s) can be added to copper unless the electrical resistance (synonymous with specific resistance) of the copper alloy exceeds 6 µΩcm. If a base matrix material is copper, examples of a metal having a wide solid solution range with copper include gold (Au), nickel (Ni), zinc (Zn), gallium (Ga), palladium (Pd), and manganese (Mn). Aluminum (Al) forms solid solutions with copper, though the solubility range is not wide.

Examples of an element having low electrical resistance (copper alloy element) include palladium (Pd), magnesium (Mg), beryllium (Be), gold (Au), calcium (Ca), cadmium (Cd), zinc (Zn), and silver (Ag). Adding these elements to pure copper at 1 at % increases electrical resistance by approximately 1 µΩcm or less. Calcium (Ca), cadmium (Cd), zinc (Zn) and silver (Ag) are preferable alloying elements because they increase electrical resistance of the copper alloy layer by 0.3 µΩcm/at % or less. Zinc and calcium are particularly preferable in terms of economy and environmental friendliness. Zinc and calcium can each be added to copper at up to 5 at %.

The amount of calcium and zinc to be added may be adjusted within the range of the additive amount described above. Adding at least 0.2 at % of zinc and calcium to copper respectively creates a prominent effect.

Adding 0.4 at % of zinc and calcium in total to pure copper produces a copper alloy having a 1.9-µΩcm electrical resistance. Hence the lower limit of electrical resistance of the copper alloy layer 8 according to the embodiments of the present invention is 1.9 µΩcm. Adding over 5 at % of calcium (Ca), cadmium (Cd), zinc (Zn) and silver (Ag) to copper prominently increases the electrical resistance of the copper alloy. It is therefore preferable to add these elements at 5 at % or less.

Zinc forms a solid solution with copper at 30 at % zinc or more and at 100° C. or less. Zinc has effects of substitutionally forming a solid solution with copper, controlling copper movement in copper grains (crystal grains), and in turn controlling copper diffusion.

Electronegativity refers to a relative measure of strength at which an atom (element) attracts an electron. The smaller electronegativity value an element has, the more likely it is to be a cation. The electronegativity of copper is 1.9. The electronegativity of oxygen is 3.5. Examples of elements having low electronegativity include alkaline earth elements, titanium group elements, and chromium group elements. An alkali element also has low electronegativity, but presence of an alkali element or water near the copper accelerates copper diffusion. Alkali elements such as sodium and potassium cannot therefore be used as a copper alloy element.

The electronegativity of calcium is only 1.0. Using calcium as a copper alloy element oxidizes calcium earlier than copper during heat treatment, etc., to become calcium oxide, thereby controlling copper diffusion. In the conductive lines according to embodiments of the present invention, calcium oxide can be selectively formed on an exposed surface of a copper alloy layer that is uncovered with a conductive metal oxide layer or at the interface between a copper alloy layer and a conductive metal oxide layer. In particular, forming calcium oxide on the exposed surface of the copper alloy layer that is not covered with a conductive metal oxide layer contributes to controlling copper diffusion and improving reliability. Annealing and other heat treatments improve the conductivity of the conductive lines and copper alloy layer according to the embodiments of the present invention. The electronegativities mentioned above are indicated by Pauling electronegativity values. In the conductive lines according to the embodiment of the present invention, the second element is preferably oxidized earlier than copper and the first element to form an oxide by a heat treatment and other process on the conductive lines. In addition, it is preferable to prevent the copper or copper alloy from being contaminated with hydrogen and oxygen.

In the embodiments of the present invention, the "first element" may be less electronegative than copper. The "second element" may form a solid solution with copper. When using two or more elements that are less electronegative than copper and form solid solutions with copper, the least electronegative element is referred to as the "second element".

For example, the first element is zinc, and the second element is calcium. Specifically, the copper alloy layer 8 is composed of 2 at % of calcium, 0.5 at % of zinc, and the balance copper. The copper alloy layer 8 has an electrical resistance of 2.6 μΩcm.

The electrical resistance of the copper alloy layer 8 may vary by approximately ±30% depending on the method by which the copper alloy layer 8 is formed and the conditions under which it is annealed. For example, for the configuration in which a copper alloy layer is directly formed on a glass substrate, the copper alloy layer is oxidized by heat treatment when and after the layer is formed (CuO, or copper oxide, is formed), resulting in deteriorated resistance. For a copper alloy having an alloy element added thereto at low density forming a copper alloy layer, i.e., a dilute alloy, copper alloy grains become too large as copper oxide is formed. As a result, coarse grain boundaries are formed with gaps, which may in turn cause the surface of the copper alloy layer to be coarse, possibly resulting in deteriorated resistance.

The embodiments of the present invention employ a configuration in which the copper alloy layer 8 is sandwiched between the first conductive metal oxide layer 7 and the second conductive metal oxide layer 9. In this configuration, heat treatment (annealing) often improves electrical resistance. In other words, in the embodiments of the present invention, covering the copper alloy layer 8 with a conductive metal oxide prevents the surface of the copper alloy layer 8 from oxidizing. In addition, the conductive metal oxide layer formed on the front and rear surfaces of the copper alloy layer 8 restricts (anchors) the copper alloy layer 8, which prevents the grains of the copper alloy layer 8 from becoming excessively large, so that the surface of the copper alloy layer 8 will not become roughened. Even if an alloy element is added to the copper alloy layer 8 at low density (e.g., approximately 0.2 at %), crystal grains are unlikely to become large, so that carrier scattering (deterioration of electrical resistance) is unlikely to occur at grain boundaries.

A prominent effect of preventing the deterioration of electrical resistance is readily created particularly when an alloy element added to the copper causes a 1 μΩcm/at % rise in specific resistance and the copper alloy layer 8 is sandwiched between the first conductive metal oxide layer 7 and the second conductive metal oxide layer 9. The present embodiment is completely different from the case where a copper alloy layer is exposed to an air atmosphere, a nitrogen atmosphere, an oxygen atmosphere, a hydrogen atmosphere and other atmosphere in that the conductive metal oxide layer formed on the front and rear surfaces of the copper alloy layer restricts (anchors) the copper alloy layer, which promotes recrystallization of fine grains in the copper alloy layer, so that the copper alloy readily becomes less resistive.

In the touch sensing lines according to the embodiments of the present invention, calcium oxide may on occasions be formed at the interface between the copper alloy layer 8 and the first conductive metal oxide layer 7 and at the interface between the copper alloy layer 8 and the second conductive metal oxide layer 9, or on a lateral surface of the copper alloy layer 8. Calcium oxide is often formed by low-temperature annealing and heat treatment, which will be described later. The calcium oxide formed on the surface of the copper alloy layer 8 or at the interface with the conductive metal oxide layers prevents copper diffusion and contributes to better reliability.

There is no need to intentionally add oxygen (O) to the copper alloy layer according to the embodiments of the present invention. A copper alloy layer containing a large amount of oxygen may cause a void therein, for example, due to the presence of water and alkali, possibly lowering reliability of the copper alloy layer.

Therefore, the first conductive metal oxide layer, the copper alloy layer, and the second conductive metal oxide layer are continuously formed at a substrate temperature from, for example, an ambient temperature (25° C.) to less than 200° C. In addition, the thus formed layer should be annealed at a low temperature that ranges, for example, from 200° C. to 300° C. in a process subsequent to the patterning of a channel layer. Alternatively, high temperature annealing over 300° C. and up to 600° C. may also be carried out. Therefore, electrical properties including electrical resistance are improved.

The copper alloy layer according to the embodiments of the present invention is a Cu—Ca alloy. In Cu—Ca alloy systems, calcium does not easily form a solid solution with copper. For example, in a sputtering target that is a starting material of a copper alloy layer, calcium easily disperses as Cu$_5$Ca and other precipitate. For a Cu—Ca—Zn alloy, calcium still does not easily form a solid solution with copper.

Cu$_5$Ca and CaO, the latter of which is formed on the surface of the copper alloy or at the interface between the conductive metal oxide and the copper alloy during heat treatment, prevents copper diffusion and contributes to higher reliability of copper lines.

Addition of zinc to the copper alloy enables zinc to form a solid solution with copper, and replaces zinc at a lattice position of copper grains to prevent copper movement, thereby primarily preventing copper migration.

Addition of calcium to the copper alloy primarily prevents copper diffusion caused by formation of CaO, Cu$_5$Ca, and other precipitates.

In the embodiments of the present invention, conductive metal oxide layers that sandwich the copper alloy layer act to, for example, enhance adhesion to the copper alloy thin film, obtain better ohmic contact in electrical mounting, improve scratch resistance, prevent copper migration, and improve reliability by means of lamination of the copper alloy layer and the conductive metal oxide layer.

(Conductive Metal Oxide Layers)

Now a description will be given of a structure of the first conductive metal oxide layer 7 and second conductive metal oxide layer 9, which are described above, and of the third conductive metal oxide layer, fourth conductive metal oxide layer, fifth conductive metal oxide layer and sixth conductive metal oxide layer, which will be discussed later. The first to sixth conductive metal oxide layers are hereinafter simply referred to as conductive metal oxide layers.

Examples of the conductive metal oxide layers include composite oxides containing two or more metal oxides selected from an indium oxide, a zinc oxide, an antimony oxide, gallium oxide, and a tin oxide.

The amount of indium (In) contained in the conductive metal oxide layers is required to be more than 80 at %. The amount of indium (In) is preferably more than 80 at %, and more preferably more than 90 at %. An indium (In) amount that is less than 80 at % is not preferred because it causes a large specific resistance in the resultant conductive metal oxide layer. A zinc (Zn) amount that is more than 20 at % is not preferred because it makes the conductive metal oxide (mixed oxide) less alkali-resistant. In the conductive metal oxide layers set forth above, all these amounts are indicated by atomic percent of metal elements in a mixed oxide (a ratio of only metal elements without the oxygen being counted). Antimony oxide can be added to the conductive metal oxide layers set forth above because antimony oxide does not easily form a solid solution region with copper and prevents copper from diffusing in the laminate configuration. A small amount of other elements such as titanium, zirconium, magnesium, aluminum, germanium, and the like may be added to the mixed oxide.

Copper layers or copper alloy layers are poorly adhesive to a transparent resin and glass substrate (used in the first transparent substrate and the second transparent substrate). If the copper layer or the copper alloy layer is applied to the display device substrate as it is, it will be hard to produce a practical display device substrate. However, the composite oxide mentioned above is sufficiently adhesive to a black matrix, a transparent resin, a glass transparent substrate etc., and also sufficiently adhesive to a copper layer and a copper alloy layer. Accordingly, if a copper layer or copper alloy layer that contains a composite oxide is applied to the display device substrate, a practical display device substrate can be produced.

Generally, copper, copper alloys, silver, silver alloys, oxides thereof, and nitrides are not sufficiently adhesive to a glass or other transparent substrate, or to the black matrix BM or other components. Accordingly, when no conductive metal oxide layer is provided, peeling may occur at an interface of the conductive lines and the glass and other transparent substrate or the conductive lines and the insulating layer formed of the black matrix or SiO$_2$. Use of copper or a copper alloy as the conductive lines of thin line patterns is not practically applicable to a display device substrate where no conductive metal oxide layer is formed as a primer layer for the conductive lines. This is because use of copper or a copper alloy invites not only potential defects due to peeling, but also potential defects due to electrostatic discharge (ESD) damage in the conductive lines during the process of manufacturing the display device substrate. Such ESD damage is a phenomenon in which static electricity accumulates in line patterns as a result of a post-process such as laminating color filters on a transparent substrate, a process such as bonding a display device substrate to an array substrate, a cleaning process and the like. The ESD damage causes pattern damage, disconnection and the like.

In addition, there is a concern that non-conductive copper oxide may be formed on the surface of the copper layer or the copper alloy layer over time, resulting in poor electrical contact. On the other hand, a composite oxide layer made such as of indium oxide, zinc oxide, antimony oxide, gallium oxide, or tin oxide can achieve stable ohmic contact and facilitate electrical implementation through conductive transfer or a contact hole.

(Antenna Unit)

Referring now to FIGS. 6 to 10, a description will be given of a specific structure of the first antenna unit 11 shown in FIG. 3.

Figure 6:
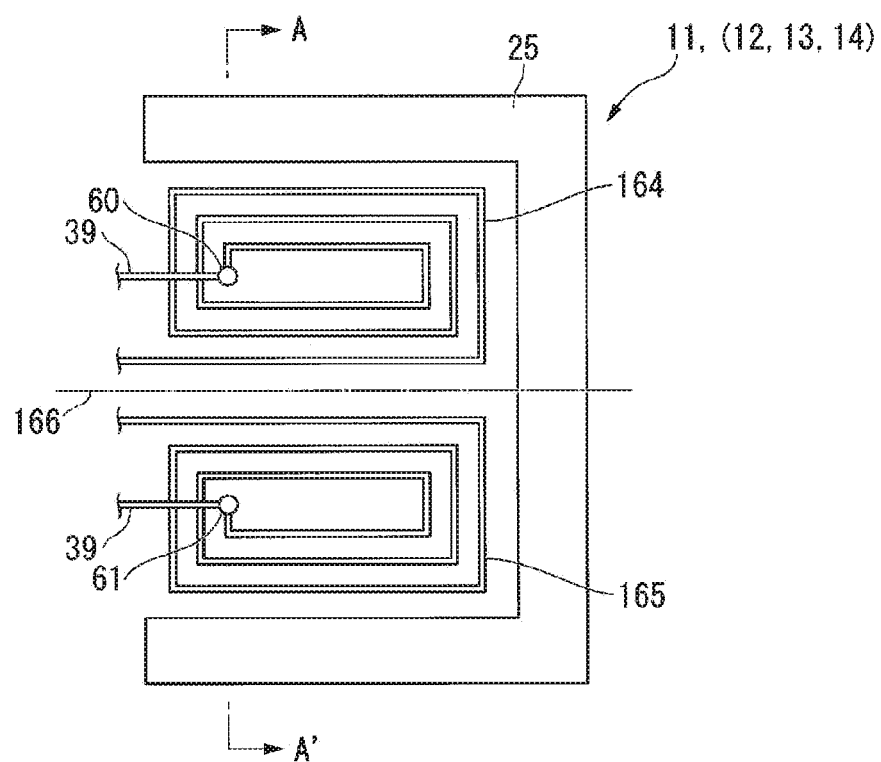
FIG. 6 is an enlarged partial plan view of a first antenna unit formed on a display device substrate constituting a display device according to a first embodiment of the present invention.
Figure 7:
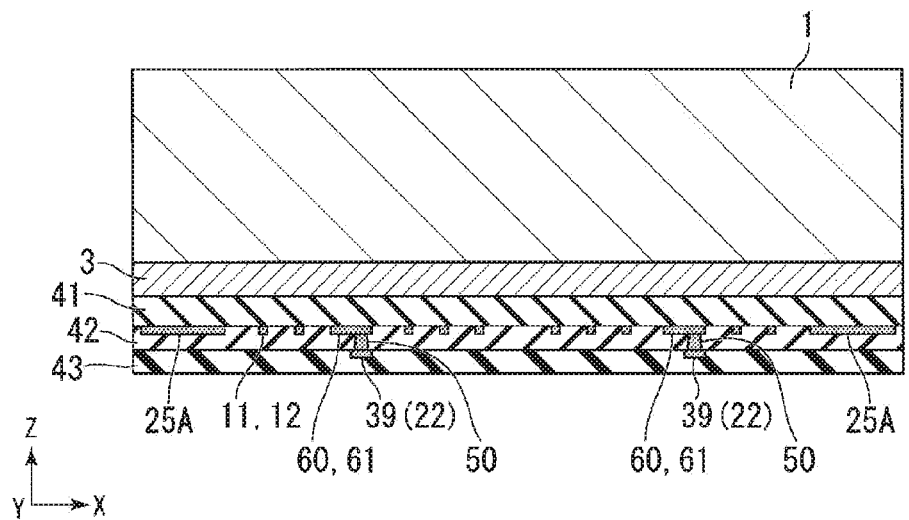
FIG. 7 is a cross-sectional view taken along the line A-A' shown in FIG. 6, illustrating a first antenna unit formed on a display device substrate constituting a display device according to a first embodiment of the present invention.
Figure 8:
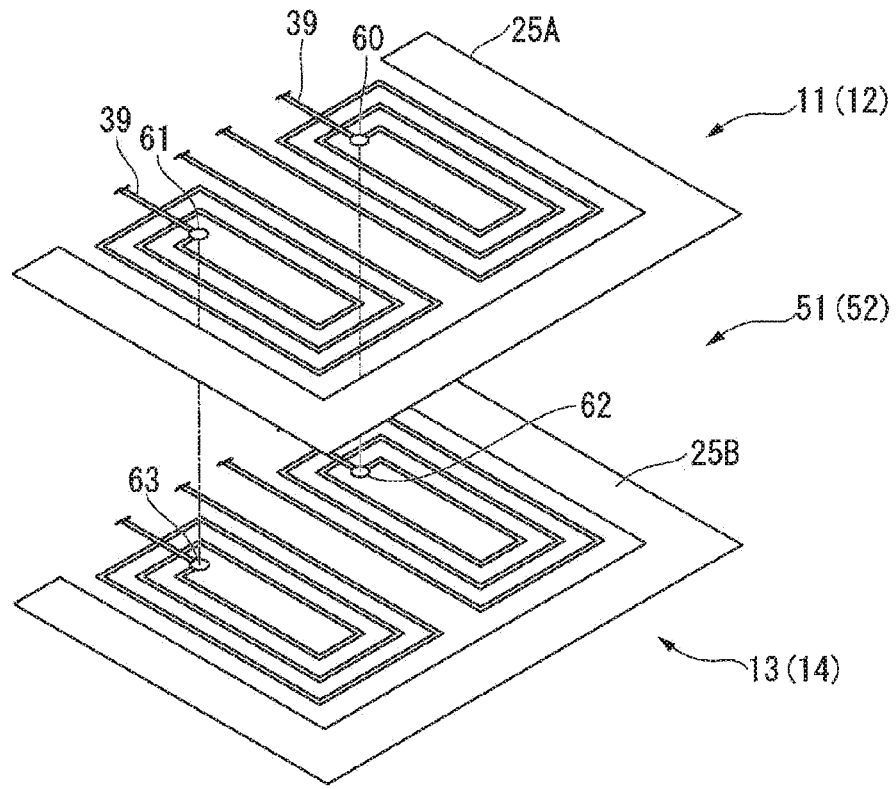
FIG. 8 is a perspective view of an overlap of a first antenna unit formed on a display device substrate constituting a display device according to a first embodiment of the present invention and a third antenna unit formed on an array substrate.
Figure 9:
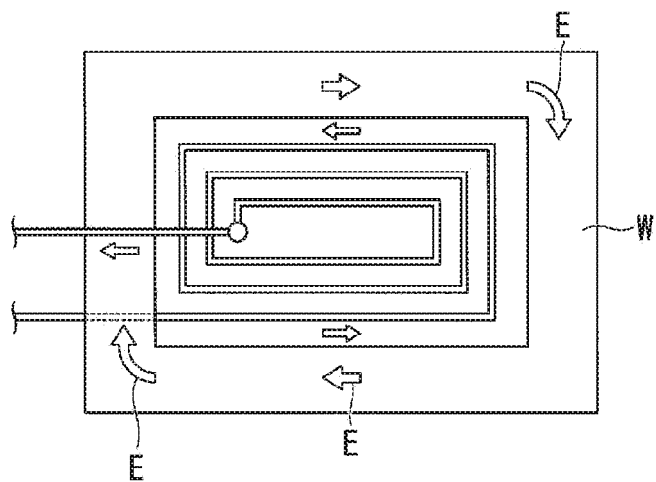
FIG. 9 is an explanatory view illustrating how an eddy current occurs on an occasion when a loop antenna is surrounded by a conductor.
Figure 10:
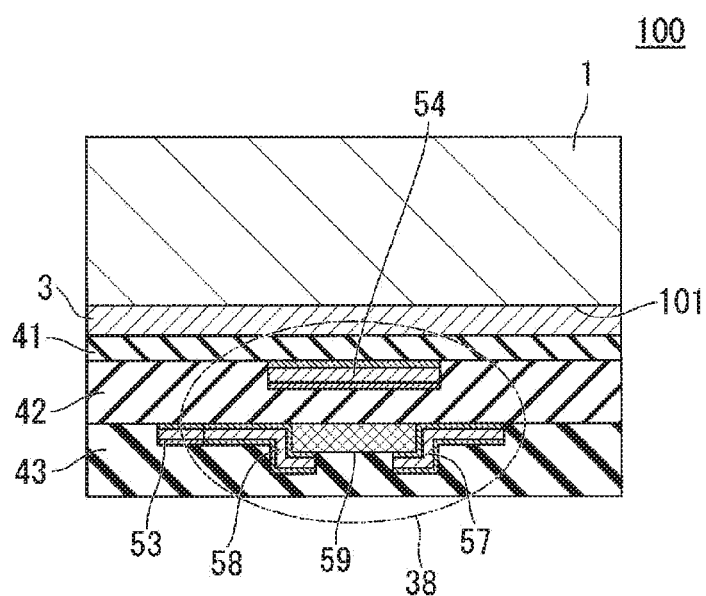
FIG. 10 is a cross-sectional view illustrating part of an active element formed on a display device substrate constituting a display device according to a first embodiment of the present invention.

FIG. 6 is an enlarged partial plan view of a first antenna unit formed on a display device substrate 100 according to the first embodiment of the present invention. FIG. 7 is a cross-sectional view taken along the line A-A' shown in FIG. 6. FIG. 8 is a perspective view of an overlap between the first antenna unit 11 formed on the display device substrate 100 and the third antenna unit 13 formed on the array substrate 200. FIG. 9 is an explanatory view illustrating how an eddy current occurs on an occasion when a loop antenna is surrounded by a conductor. FIG. 10 is a cross-sectional view illustrating part of an active element formed on the display device substrate 100.

The following description refers to the structure of the first antenna unit 11 as representative of the first antenna unit 11, the second antenna unit 12, the third antenna unit 13 and the fourth antenna unit 14, but a similar structure can be employed in other antenna units as well. In the following description, these antennas may be each simply referred to as an "antenna unit".

The term "antenna unit" in the present invention refers to a configuration in which one or more antennas are arranged on a substrate for the purpose of transmitting and receiving a touch sensing signal or of receiving and supplying power. If the antenna unit is shaped as a loop (a coplanar coil formed in a spiral pattern), two antennas each wound in directions opposite to each other are preferably adjacent to each other to ensure stable communication. Two or more antennas each wound in directions opposite to the other can be alternately placed adjacent to each other and one set of antennas selected therefrom may be used.

As shown in FIG. 8, the first antenna unit 11 of the display device substrate 100 and the third antenna unit 13 of the array substrate 200 have an identical loop antenna shape in plan view, and are aligned and overlap with each other (to produce a first overlapping portion 51). Similarly, the second antenna unit 12 of the display device substrate 100 and the fourth antenna unit 14 of the array substrate 200 have an identical loop antenna shape in plan view, and are aligned and overlap with each other (to produce a second overlapping portion 52).

In the first overlapping portion 51 and the second overlapping portion 52, the positional accuracy of an antenna is preferably within ±3 μm because the conductive lines forming the antenna are narrow, e.g., 1 μm to 20 μm wide and the antenna unit has to fit in a narrow frame region 72. Higher accuracy in positional alignment enables more efficient signal transmission or reception. Connecting two or more loop antennas in parallel enables miniaturization of the antennas and fast contactless data transfer. In FIGS. 6 to 8, capacitors and other components for forming a resonant circuit for each of the first antenna unit 11 and the second antenna unit 12 and for each of the third antenna unit 13 and the fourth antenna unit 14 are not illustrated.

Triple-layered conductive lines in which the copper alloy layer described above is sandwiched between conductive metal oxide layers can be used to form the antennas. The first antenna unit 11 and the second antenna unit 12 can be formed in the same layer and process as the first conductive line 21 is. The third antenna unit 13 and the fourth antenna unit 14 can be formed in the same layer and process as the third conductive line 23 (or fourth conductive line 24) is.

Each of the first antenna unit 11, the second antenna unit 12, the third antenna unit 13 and the fourth antenna unit 14 is constituted by a pair of loop antennas each of which is wound in the direction opposite to the other. Each of the loop antennas each wound in the direction opposite to the other generates a magnetic field in a direction opposite to the other, thereby enabling stable transmission or reception with less noise. In other words, each of a pair of loop antennas each wound in the direction opposite to the other creates an effect of shielding the external magnetic field by forming a magnetic field oriented in a direction different from the other, which can in turn reduce the influence of external noise.

The loop antenna is preferably wound 2 or 3 times or more, and can be wound 3 to 20 times if the antenna measures 5 mm or less externally. The antenna is wound three times in the first embodiment. In plan view, a loop antenna wound twice or more assumes a curve that comes close to the center of the loop antenna on the same plane. An Archimedean spiral with almost equally spaced lines is a typical example.

Generally, a loop antenna represented by an RFID antenna needs to meet the following three requirements to achieve long distance communication:

(a) increasing the number of turns;

(b) for example, a large antenna diameter, such as of a card size, on an assumption of a frequency of 13.56 MHz; and (c) having conductive lines with sufficient conductivity.

The antenna diameter is based on an average length of the major axis and minor axis thereof in plan view. On the other hand, the communication distance of the loop antenna according to the embodiments of the present invention is the thickness of the sealing layer used in the organic EL layer or of the liquid crystal layer, which has only to be, for example, approximately 0.5 μm to 5 μm. The limitations described above are therefore almost eliminated. In other words, the loop antenna according to the embodiments of the present invention only requires a short communication distance of approximately 0.5 μm to 5 μm, unlike a common RFID antenna, thereby significantly mitigating a noise influence on the driving circuit of the liquid crystal layer and the like. The loop antenna according to the embodiments of the present invention has a low far-field radiation intensity, and is therefore subject to almost no legal limitation of normal antenna resonant frequencies.

A frequency convenient for touch sensing can be selected as a resonant frequency of the loop antenna according to the embodiments of the present invention, such as n times (n is an integer equal to or greater than 1) of a touch sensing driving frequency.

To mitigate the influence of noise arising from a driving circuit of a liquid crystal layer and the like, a backlight unit driving circuit, or a 100 V or other external power source, the antenna units 11, 12, 13, and 14 are planarly surrounded in the present embodiment by substantially U-shaped conductor patterns 25A, 25B shown in FIG. 6 and FIG. 8.

If the conductor patterns each assume an electrically closed shape W (electrically connected shape) as shown in FIG. 9, the current flowing in the direction opposite to the current flowing through the loop antenna flows into the conductor patterns, which lowers the efficiency of the loop antenna. Preferably, therefore, the conductor patterns 25A, 25B are substantially U-shaped and partially enclose the antenna units (loop antennas), rather than being annular and fully enclosing the same. The conductor patterns 25A, 25B are preferably grounded to, for example, the housing of the display device.

As described above, the conductor patterns 25A, 25B are preferably configured with the copper layer or copper alloy layer being sandwiched between the first conductive metal oxide layer and the second conductive metal oxide layer.

For example, each of the antenna units 11, 12, 13, and 14 may be a pair of antennas each wound in directions opposite to the other in plan view. Being wound in the opposite direction can be defined as being wound in the direction in which the loop antennas 164, 165 arranged in the upper and lower positions (or the left and right positions) shown in FIG. 6 are linearly symmetrical relative to a center 166 in plan view.

In the overlapping portion (first overlapping portion 51) of the first antenna unit 11 and the third antenna unit 13, a touch driving signal from the CPU is received or a touch detection signal output from the touch detection switching circuit 19 through the touch signal transmission or reception controller 20 is transmitted, for example. The touch driving signal drives the touch driving switching circuit 18 via the touch driving controller 17. In other words, the first overlapping portion 51 where the first antenna unit 11 and the third antenna unit 13 overlap each other has function of transmitting or receiving touch sensing signals.

In the overlapping portion (second overlapping portion 52) of the second antenna unit 12 and the fourth antenna unit 14, the second antenna unit 12 receives power from electromagnetic waves of resonant frequency generated by the fourth antenna unit 14, for example. In other words, the second overlapping portion 52 of the second antenna unit 12 and the fourth antenna unit 14 has a function of receiving a power signal.

The roles of the overlapping portion between the first antenna unit 11 and the third antenna unit 13 can be interchanged with those of the overlapping portion between the second antenna unit 12 and the fourth antenna unit 14.

As shown in FIG. 7, the black matrix 3 is formed on the first transparent substrate 1, the lower insulating layer 41 is formed on the black matrix 3, and the first antenna unit 11 and second antenna unit 12 are formed on the lower insulating layer 41. As is apparent by comparison of FIG. 3, FIG. 5 and FIG. 7, the first conductive lines 21, the fifth conductive lines 55, the first antenna unit 11, and the second antenna unit 12 are formed on the lower insulating layer 41. That is to say, the first conductive lines 21, the fifth conductive lines 55, the first antenna unit 11 and the second antenna unit 12 are located on the same layer.

More specifically, patterning the first conductive metal oxide layer 7, the copper alloy layer 8 (or a copper layer), and the second conductive metal oxide layer 9 (a triple-layered conductive layer) by a well-known photolithography method after formation of the triple-layered conductive layer on the lower insulating layer 41 forms the pattern of each of the conductive lines 21, the fifth conductive lines 55, the first antenna unit 11, and the second antenna unit 12. "Located on the same layer" in the present invention means disposing each line layer (conductive lines and antenna units) as an identical layer by patterning after the formation of the triple-layered conductive layer on the substrate, and also means that the lines and the antennas are provided on an identical layer with an identical layer configuration and identical material.

Each of first antenna unit 11 and second antenna unit 12 formed of the conductive lines (first conductive lines 21) of an identical layer configuration is electrically connected to different conductive lines (second conductive lines 22) via first connection pads 60, 61. For example, the gate electrodes 54 (gate lines, see FIG. 10) constituting one of the first active elements 38 are located on the same layer as identically configured conductive lines (first conductive lines) are, while the source line 53 and the source electrode 58 constituting the first active element 38 are located on the same layer as the second conductive lines 22 are. The first touch sensing line unit is formed of the fifth conductive lines 55 located on the same layer as the first conductive lines are, while the second touch sensing line unit is formed of the sixth conductive lines 56. As described above, double-layered lines formed of the first conductive lines 21 and the second conductive lines 22 are utilized in an antenna or an active element in the embodiments of the present invention.

The touch driving switching circuit 18, the gate signal switching circuit 27, and the like, which will be described below, include double-layered lines formed of active elements (thin film transistors) or first conductive lines and second conductive lines, but the details thereof are omitted in FIG. 2 and FIG. 12.

(First Active Elements 38)

The power receiver 15, the power supply controller 16, the touch driving controller 17, the touch driving switching circuit 18, the touch detection switching circuit 19, the touch signal transmission or reception controller 20 and the detection and AD conversion unit 30, all of which are formed on the display device substrate 100, include a first active element 38 as a switching element.

As shown in FIG. 10, each first active element 38 is bottom-gated and formed in the frame region 72 of the first transparent substrate 1. The first active elements 38 are formed on the first surface 101 of the first transparent substrate 1 via the black matrix 3 and the lower insulating layer 41. The black matrix 3 that serves as a foundation may be removed to form, on the lower insulating layer 41, a portion in which to form the first active elements 38.

In each first active element 38, the gate electrode 54 is formed of conductive lines having the same configuration as that of the first conductive lines 21 and formed in the same process as the first conductive line 21 is. On the gate electrode 54, a gate insulating layer 42 (first-substrate-side insulating layer), a channel layer 59, a drain electrode 57, and a source electrode 58 are laminated. The gate electrode 54 is electrically connected to a gate line that is connected to the gate electrode 54, while the source electrode 58 is electrically connected to the source line 53.

The plurality of first active elements 38 and a resistive element formed by patterning a film of a conductive metal oxide layer or an oxide semiconductor forms the touch driving switching circuit 18, the touch detection switching circuit 19, the touch signal transmission or reception controller 20, the wave detection and AD conversion unit 30, the power receiver 15, the power supply controller 16, the touch driving controller 17, all of which are shown in FIG. 3. A capacitor for the first antenna unit 11 and the second antenna unit 12 may be formed when the first conductive lines 21 and the second conductive lines 22 are formed. Specifically, the capacitor can be formed by patterning the conductive layer having the same configuration as that of the first conductive line 21 and the second conductive line 22 so as to have a desired size above and below the first-substrate-side insulating layer 42. The channel layer 35 constituting each first active element 38 is made of an oxide semiconductor.

(Oxide Semi Conductor)

The oxide semiconductor contains at least, for example, indium oxide and gallium oxide, and additionally, any one or more of antimony oxide, bismuth oxide, and zinc oxide. Annealing such an oxide semiconductor at a low temperature that ranges, as described above, from 200° C. to 350° C. can promote crystallization and stabilize the properties thereof. Such a low-temperature process improves compatibility with a color filter based on an organic resin or an organic pigment and with a resin substrate such as a polyimide resin substrate and an aramid resin substrate. For example, a black matrix in which carbon is dispersed in a resin is formed on the substrate, and in some cases, an active element in which an oxide semiconductor is used as a channel layer may be formed. Advantageously in this case, low-temperature annealing can be still carried out in the range of 200° C. to 300° C. in which the black matrix is heat resistant, thereby improving the reliability of the oxide semiconductor.

Changing an amorphous oxide semiconductor to a crystalline oxide semiconductor can improve its carrier mobility and reliability. Indium oxide and gallium oxide have a high melting point as oxides, while antimony oxide ($Sb_2O_3$) and bismuth oxide ($Bi_2O_3$) both have a low melting point of 1000° C. or less. For example, using a ternary composite oxide composed of indium oxide ($In_2O_3$), gallium oxide ($Ga_2O_3$), and antimony oxide can lower the crystallization temperature of the composite oxide due to the effect of the antimony oxide, which has a low melting point. In other words, an amorphous oxide semiconductor that can be easily turned into a microcrystalline state or the like can be provided. An increase in crystallinity of an oxide semiconductor can improve carrier mobility. The microcrystalline oxide semiconductor film is an oxide semiconductor film in which crystal grains are at least 1 nm to 3 nm in size or crystal grains are larger than 3 nm by an observation method such as TEM.

The oxide semiconductor needs to have solubility in wet etching in a downstream process, and thus a composite oxide rich in zinc oxide, a composite oxide rich in gallium oxide, or a composite oxide rich in antimony oxide can be used for the oxide semiconductor. For example, an atom ratio (excluding the atomic weight of oxygen) of a metal element of a metal oxide target used for sputtering may be In:Ga:Sb=1:

2:2, In:Ga:Sb=1:3:3, In:Ga:Sb=2:1:1, In:Ga:Sb=1:1:1, and In:Ga:Sb=1:0.25:1. Sb can be replaced with, for example, Zn (zinc) or Bi (bismuth).

For example, the metal oxide target may be a binary composite oxide of indium oxide and antimony oxide with an atomic ratio of In:Sb=1:1. Alternatively, for example, the metal oxide target may be a binary composite oxide of indium oxide and bismuth oxide with an atomic ratio of In:Bi=1:1. In the above atomic ratio, the amount of In may be further increased.

Also, for example, Sn may be added to the above composite oxide. In this case, a composite oxide having a quaternary composition containing $In_2O_3$, $Ga_2O_3$, $Sb_2O_3$, and $SnO_2$ or a composite oxide having a ternary composition containing $In_2O_3$, $Sb_2O_3$, and $SnO_2$ is obtained, and carrier concentration can be adjusted. $SnO_2$ having a valence different from those of $In_2O_3$, $Ga_2O_3$, $Sb_2O_3$, and $Bi_2O_3$ acts as a carrier dopant.

An active element (thin film transistor) using an oxide semiconductor as a channel layer has an extremely high electrical breakdown voltage. It is very preferable to form a touch sensing circuit with such an active element that can withstand voltage fluctuations caused by the noise between the third antenna unit and the fourth antenna unit and by the external noise picked up by the touch lines.

Using an oxide semiconductor as a channel layer and using a source electrode, a drain electrode, and a gate electrode to which the conductive line according to an embodiment of the present invention is applied can provide an n-type thin film transistor (active element). Making the channel layer to be of p-type can provide a p-type thin film transistor.

(Second Active Elements 48)

Now a description will be given of the second active elements 48 formed in the effective display region 71 of the array substrate 200. FIG. 11 is a cross-sectional view illustrating part of one of the second active elements 48 formed on the array substrate 200.

The second active element 48 is bottom-gated and includes a gate electrode 33 (gate line), a source line 31, a source electrode 32, a channel layer 35, and a drain electrode 37. The gate line and the source line are electrically connected to the second active element 48. The drain electrode 37 of the second active element 48 that is electrically connected to the pixel electrode 49 through the contact hole 90 drives the liquid crystal layer 4. In the array substrate 200, an active element having the same configuration as the second active element 48 is also formed in the frame region of the array substrate 200. In the frame region of the array substrate 200, the plurality of the second active elements 48, and resistive elements formed by patterning a film of the conductive metal oxide layer or an oxide semiconductor constitute the source signal switching circuit 26, the gate signal switching circuit 27, and the power transmission unit 28 and the signal transceiver 29. The power transmission unit 28 drives the fourth antenna unit 14 to transmit power to the second antenna unit 12. The signal transceiver 29 drives the third antenna unit 13 to transmit and receive a touch signal between the first antenna unit 11 and the third antenna unit 13.

Preferably, a frame is defined by a black matrix with light-shielding properties outside the effective display region to improve visibility. There is, however, no need to form the frame all over the frame region, but the light-shielding black matrix may not form the frame in a region in which to form the first active elements for, e.g., a touch driving switching circuit. In addition, a frame-shaped light-shielding pattern may be formed, e.g., on the rear surface of a cover glass, which is laminated as a protective glass on the surface of the first transparent substrate 1, which serves as an observation plane.

The power source of source signal switching circuit 26, the gate signal switching circuit 27, the power transmission unit 28, and the signal transceiver 29 formed in the frame region of the array substrate 200 are connected to a battery (not shown) via an FPC or to a 100 V external power supply via an adapter (not shown).

In addition, a color filter such as a red filter, a green filter, and a blue filter may be disposed on the pixel aperture 10 of the first transparent substrate 1 or the pixel aperture 10 of the second transparent substrate 2.

In the first embodiment, a composite oxide having an element ratio of In:Ga:Sb=1:0.25:1 is formed into a microcrystalline oxide semiconductor through low-temperature annealing at 280° C. to be used in the channel layer 35. A copper alloy having an element ratio of In:Ca:Zn=97.5:2:0.5 is used in the copper alloy layer in the first embodiment.

(Touch Sensing)

There is no need to use all of the touch sensing lines included in the first touch sensing line unit and the second touch sensing line unit for touch sensing. Thinned-out driving may be conducted. Thinned-out driving of the touch sensing lines will now be described. First, the touch sensing lines are all divided into a plurality of groups. The number of groups should be fewer than the total number of the touch sensing lines. Let us assume that one group consists of six lines. For example, two are selected from the six lines (i.e., the selected number is smaller than the total number of lines; 2<6). In each group, the selected two lines are used for touch sensing, and the potentials of the remaining four lines are set to a floating potential. Touch sensing can be carried out for each group at which a touch sensing function is defined.

The area or capacity of a touch pointer that touches or comes close to the display screen is different depending on whether the pointer is a finger or a pen. The number of lines to be thinned out can be adjusted depending on the size of such pointers. A fine-tipped pointer, which has a pen tip or a needle tip, enables reduction in the of number of lines to be thinned out and use of a matrix having high-density touch sensing lines. Touch sensing can be carried out as dense touch sensing lines at a time of fingerprint authentication. Thinned-out driving can reduce the power consumption associated with touch sensing.

Touch sensing driving and liquid crystal driving may be carried out in a time-sharing manner. The touch driving frequency may be adjusted according to the required touch input speed. The touch driving frequency may be higher than the liquid crystal driving frequency. The touch driving frequency is desirably high because of the irregularity of timing and the short time duration of touch or approach of the finger or other pointer to the observer side surface of the display device. There are several methods for differentiating between the touch driving frequency and the liquid crystal driving frequency. For example, in normally-off liquid crystal driving, a backlight may also be turned off in a black mode (off state), during which (during a period when liquid crystal display is not affected) touch sensing may be carried out. In this case, various touch driving frequencies can be selected.

(Forming a Circuit with an Active Element)

In the embodiment described above, forming a film of conductive metal oxide layer or an oxide semiconductor in a desired pattern can form a resistive element. In addition, forming on the array substrate 200 a matrix of a thin film transistor (active element) having a polysilicon semiconductor as a channel layer before forming a through-hole in the insulating layer can laminate via the through-hole a matrix of a thin film transistor (active element) using an oxide semiconductor as the channel layer.

An inverter circuit and an SRAM can be formed by a well-known technique with a resistive element and an n-type thin film transistor. Similarly, a logical circuit such as a ROM circuit, a NAND circuit, a NOR circuit, a flip-flop, a shift register, and the like can be formed. Oxide semiconductors can form a power-saving circuit because they have a very small leakage current. Oxide semiconductors can provide a good memory element because they have a memory property (voltage retention property) that silicon semiconductors do not have. Alternatively, in the array substrate 200, an active element matrix that uses a polysilicon semiconductor as a channel layer may be laminated as a first layer, and an active element matrix that uses an oxide semiconductor as a channel layer may be laminated as a second layer to form the memory and logic circuit described above. The channel layer may also be formed of a polysilicon semiconductor or an amorphous silicon semiconductor as necessary.

Second Embodiment

Figure 12:
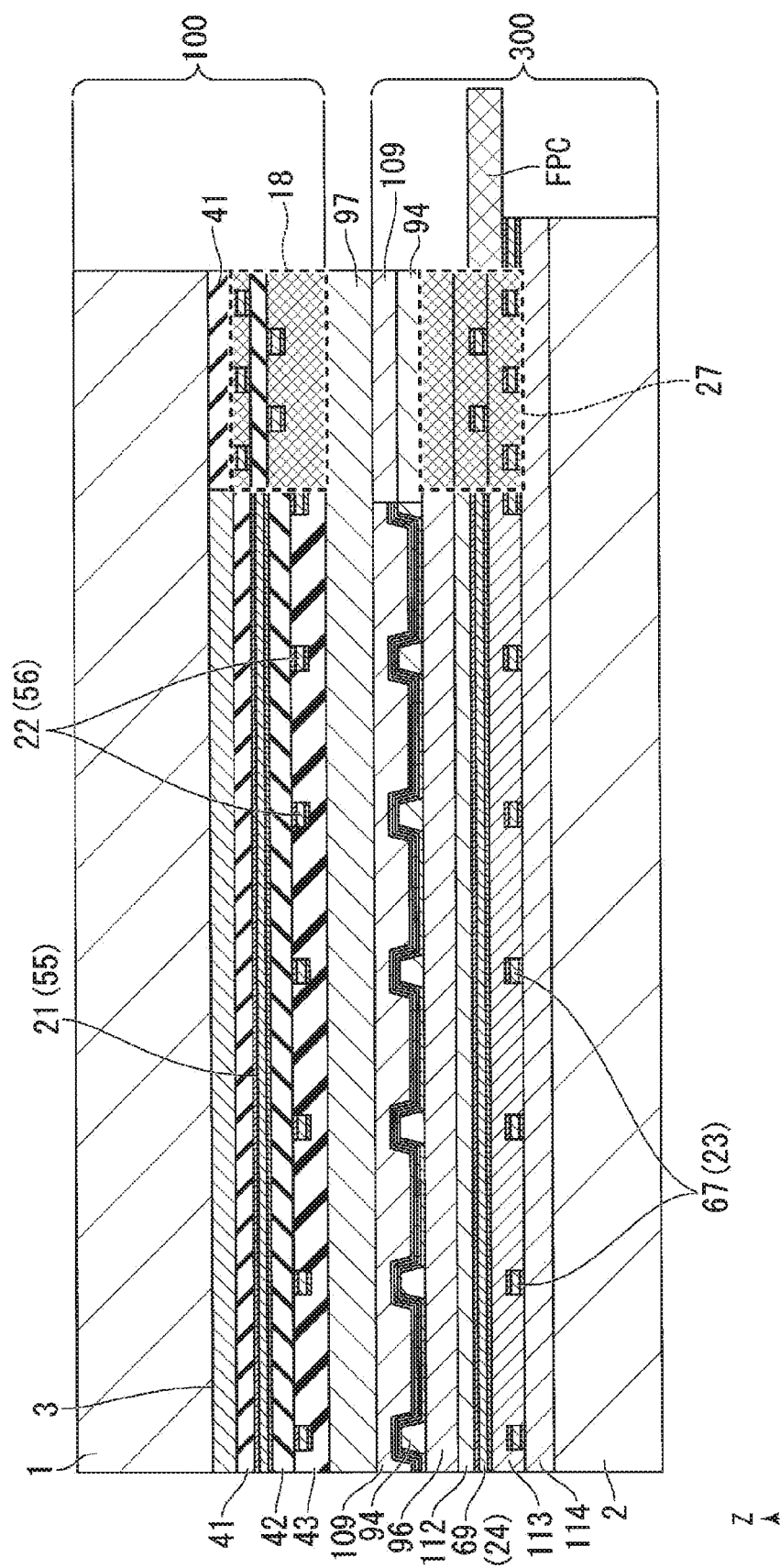
FIG. 12 is a cross-sectional view of a display device according to a second embodiment of the present invention.
Figure 13:
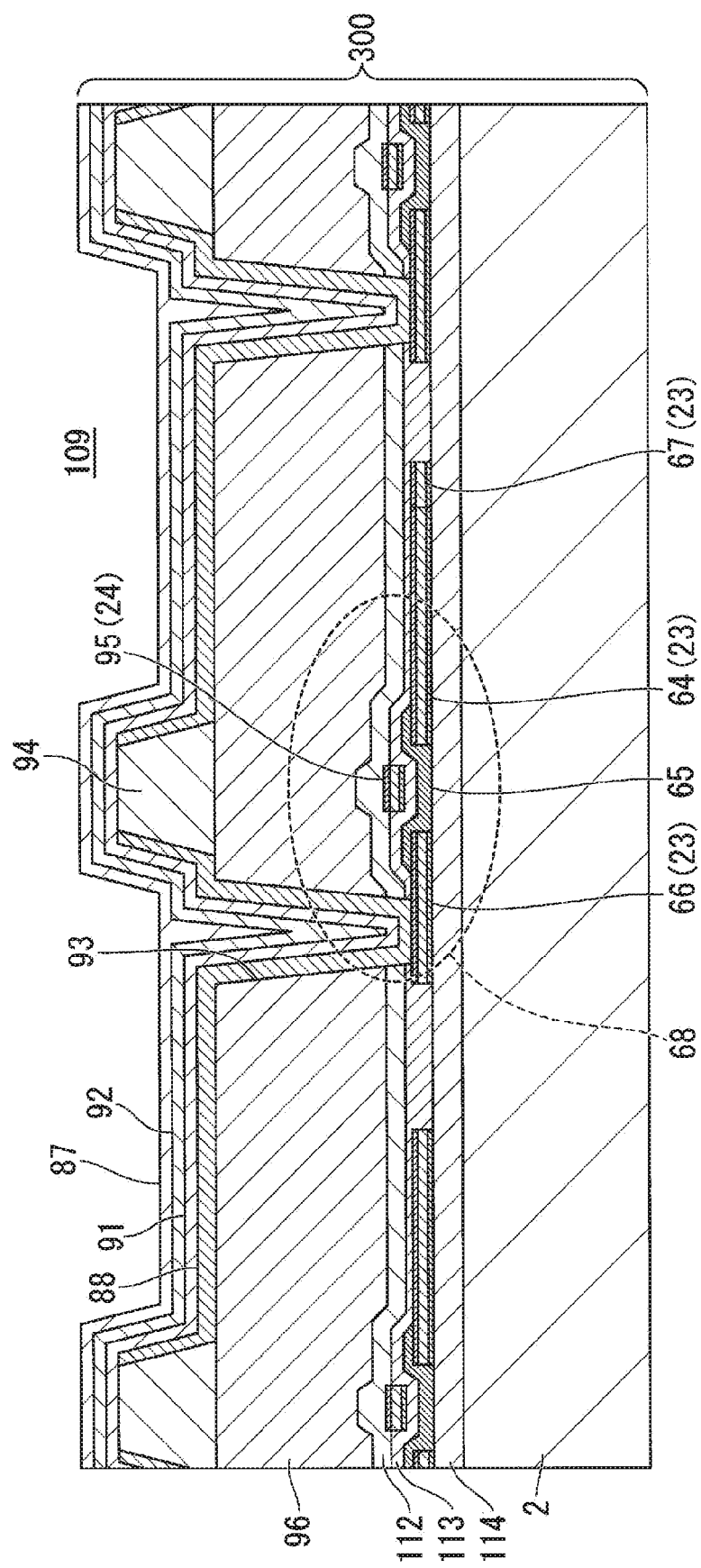
FIG. 13 is a cross-sectional view illustrating part of an array substrate constituting a display device according to a second embodiment of the present invention, illustrating active elements and an organic EL luminescent layer formed on the array substrate.
Figure 14:
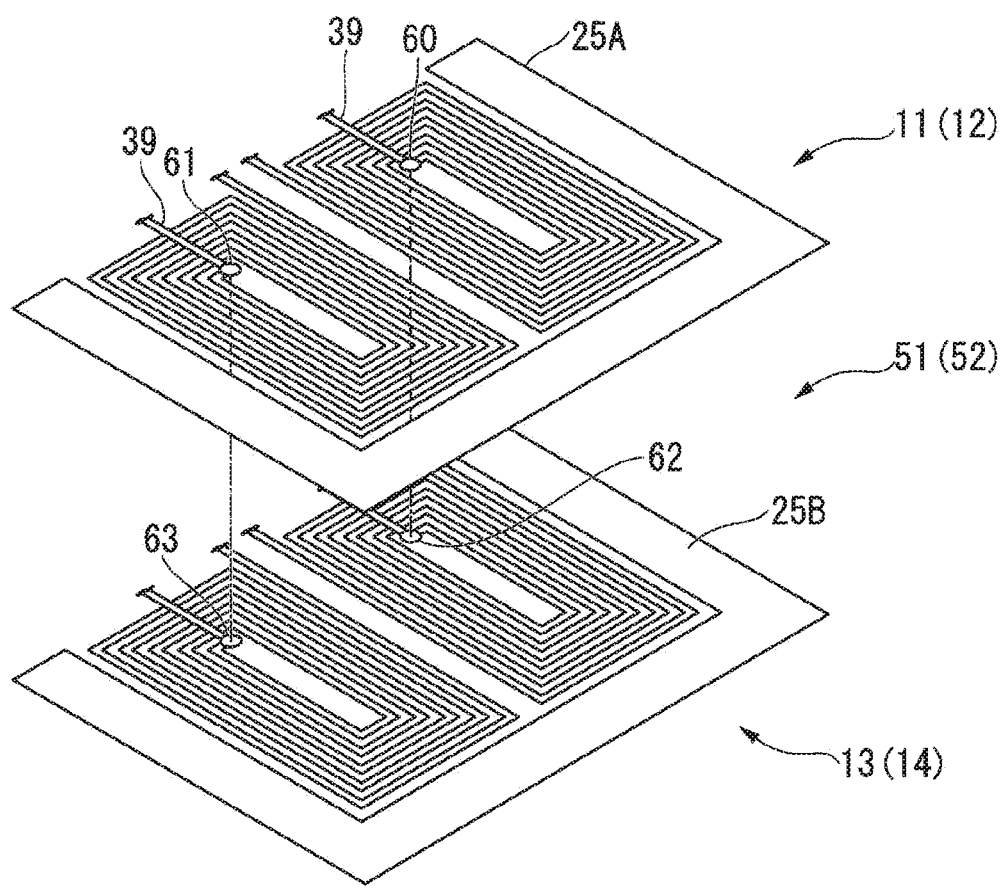
FIG. 14 is a perspective view showing how a first antenna unit formed on a display device substrate constituting a display device and a third antenna unit formed on an array substrate according to a second embodiment of the present invention overlap with each other.

With reference to FIGS. 12 to 14, a display device DSP2 according to a second embodiment of the present invention will now be described.

In the second embodiment, components identical to those of the embodiment described above are given the same reference signs to omit or simplify the description thereof.

FIG. 12 is a cross-sectional view illustrating part of a display device DSP2 according to the second embodiment of the present invention. FIG. 13 is a cross-sectional view illustrating part of an array substrate constituting a display device DSP2 according to a second embodiment of the present invention, illustrating active elements and an organic EL luminescent layer formed on the array substrate. FIG. 14 is a perspective view of an overlap of a first antenna unit formed on a display device substrate constituting a display device DSP2 according to a second embodiment of the present invention and a third antenna unit formed on an array substrate.

As shown in FIG. 12, the display device DSP2 is an organic electroluminescence (hereinafter referred to as an "organic EL") display device in which the first transparent substrate 1 and the second transparent substrate 2 are bonded together via an adhesive transparent resin layer 97.

In the display device DSP2 according to the embodiments of the present invention, the display function layer is a luminescent layer 92 (organic EL layer) and a hole injection layer 91, and the second active element is a thin film transistor (TFT: thin film transistor), which drives the luminescent layer 92.

The structure of the display device DSP2 in plan view is not illustrated because it is similar to the first embodiment. A color filter such as a red filter, a green filter, a blue filter, and the like may be disposed on the pixel aperture 10 as in the first embodiment.

A black matrix 3 is not formed in the frame region of the first transparent substrate 1 in the display device substrate 100 but a circuit such as the touch driving switching circuit 18 is formed on the lower insulating layer 41 with an active element (not shown). Such a circuit is not illustrated because it is similar to the first embodiment.

The first surface 101 of the first transparent substrate 1 is provided with a first touch sensing line unit constituted by the fifth conductive lines 55 formed in the X direction (first direction) and a second touch sensing line unit constituted by the sixth conductive lines 56 formed in the Y direction (second direction). Similar to the first embodiment, these touch sensing line units include the first active elements 38, the first conductive lines 21 and the second conductive lines 22 as the components of a circuit that controls touch sensing. The first conductive lines 21 and fifth conductive lines 55 have the same conductive line structure and are formed as an identical layer. The second conductive lines 22 and sixth conductive lines 56 have the same conductive line structure and are formed as an identical layer.

In FIG. 12, the first antenna unit 11 and the second antenna unit 12 (neither shown) are disposed on the first surface 101 of the first transparent substrate 1 at a deep position of the touch driving switching circuit. The organic EL driving switching circuit, the third antenna unit 13, and the fourth antenna unit 14 (none shown in FIG. 12) are disposed on the surface of the substrate 2 facing the first transparent substrate 1.

As shown in FIG. 14, loop antennas constituting the first antenna unit 11, the second antenna unit 12, the third antenna unit 13 and the fourth antenna unit 14 are each wound five times. To mitigate an influence of external noise coming, substantially U-shaped conductor patterns 25A, 25B are formed on three sides of each antenna unit. The first antenna unit 11 of the display device substrate 100 and the third antenna unit 13 of the array substrate 200 have the same loop antenna shape in plan view, are aligned and overlap with each other (first overlapping portion 51). Similarly, the second antenna unit 12 of the display device substrate 100 and the fourth antenna unit 14 of the array substrate 200 have an identical loop antenna shape in plan view, and are aligned and overlap with each other (to produce a second overlapping portion 52).

The conductive line forming the antenna is 6 µm wide and within ±2 µm in positional accuracy (alignment accuracy). Similar to the first embodiment, these conductive lines are triple-layered with a copper alloy layer being sandwiched between conductive metal oxide layers.

For example, reception of a touch driving signal coming from the CPU is received, or transmission of a touch detection signal output from the touch detection switching circuit 19 through the touch signal transmission or reception controller 20 takes place in the overlapping portion (first overlapping portion 51) of the first antenna unit 11 and the third antenna unit 13, as in the first embodiment. The touch driving signal drives the touch driving switching circuit 18 via the touch driving controller 17.

In the overlapping portion (second overlapping portion 52) of the second antenna unit 12 and the fourth antenna unit 14, the second antenna unit 12 receives power from electromagnetic waves of resonant frequency generated by the fourth antenna unit 14, for example. The power receiver 15 smoothes a received voltage and outputs a constant voltage to the power supply controller 16 as a touch driving voltage.

The first antenna unit 11 and the second antenna unit 12 have the same configuration as the first conductive line 21 and are located on the same layers. The first antenna unit 11 and the second antenna unit 12 are each provided with the first connection pads 60, 61 on the inner side thereof. The first connection pads 60, 61 are formed on the inner side of each of the first antenna unit 11 and the second antenna unit 12. The first antenna unit 11 and the second antenna unit 12 are each connected to part of the second conductive lines 22 via a through-hole provided on the insulating layer 42 (first-substrate-side insulating layer) on the first connection pads 60, 61. The first conductive lines 21 and the second conductive lines 22 are each double-layered via the insulating layer 42 (first-substrate-side insulating layer).

The third antenna unit 13 and the fourth antenna unit 14 have the same configuration as the third conductive line 23 and are located on the same layer. The third antenna unit 13 and the fourth antenna unit 14 are each provided with the second connection pads 62, 63 on the inner side thereof. The second connection pads 62, 63 are formed on the inner side of each of the third antenna unit 13 and the fourth antenna unit 14. The third antenna unit 13 and the fourth antenna unit 14 are respectively connected to part of the fourth conductive lines 24 via a through-hole provided on the insulating layer 113 (second substrate side insulating layer) on the second connection pads 62 and 63. The third conductive lines 23 and the fourth conductive lines 24 are double-layered via the insulating layer.

The structure of the second transparent substrate 2 that constitutes the display device of the second embodiment will now be described with reference to FIGS. 12 and 13.

A substrate of an array substrate 300 does not need to be transparent. Examples of the substrate applicable to the array substrate 300 include a glass substrate, a ceramic substrate, a quartz substrate, a sapphire substrate, a semiconductor substrate such as of silicon, silicon carbide, or silicon germanium, and a plastic substrate. For example, a visible transparent substrate such as a glass substrate can be used as the display device substrate 100 and a silicon substrate can be used as the array substrate 300 to constitute a reflective display device.

In the array substrate 300, the lower insulating layer 114, the active element 68 (second active elements) formed on the lower insulating layer 114, the insulating layer 113 (second-substrate-side insulating layer) formed covering the lower insulating layer 114 and the active elements 68, the gate electrode 95 formed on the insulating layer 113 so as to face the channel layer 65 of each active element 68, the upper insulating layer 112 formed covering the insulating layer 113 and the gate electrode 95, and the flattening layer 96 formed on the upper insulating layer 112 are laminated on the substrate 2 in this order. The channel layer 65 is formed of an oxide semiconductor.

The flattening layer 96 has a contact hole 93 at a position corresponding to a drain electrode 66 of the active element 68. Furthermore, on the flattening layer 96, a bank 94 is provided at a position corresponding to the channel layer 65. In a region between the banks 94 adjacent to each other in cross-sectional view, i.e., a region surrounded by the banks 94 in plan view, the lower electrode 88 (pixel electrode) is provided so as to cover an upper surface of the flattening layer 96, an inside of the contact hole 93, and the drain electrode 66.

The lower electrode 88 may not necessarily be formed on the upper surface of the bank 94.

Furthermore, a hole injection layer 91 is provided so as to cover the lower electrode 88, the bank 94, and the flattening layer 96. A light emitting layer 92, an upper electrode 87, and a sealing layer 109 are sequentially laminated on the hole injection layer 91.

As described later, the lower electrode 88 has a configuration in which a silver layer or a silver alloy layer is sandwiched between conductive metal oxide layers.

For example, the upper electrode 87 is a transparent conductive film in which a silver alloy layer having a film thickness of 11 nm is sandwiched between composite oxide layers having a film thickness of 40 nm. The lower electrode 88 has a configuration in which a silver alloy layer having a film thickness of 250 nm is sandwiched between composite oxide layers having a film thickness of 30 nm. It is preferable to apply the above composite oxide layers to the conductive metal oxide layers, set a film thickness of the silver alloy layer, for example, in the range of 9 nm to 15 nm, and employ a three-layer laminate structure in which the silver alloy layer is sandwiched between the conductive metal oxide layers. In this case, a transparent conductive film having a high transmittance is achieved.

Alternatively, it is possible to apply the above composite oxide layers to the conductive metal oxide layers, set a film thickness of the silver alloy layer, for example, in the range of 100 nm to 250 nm or to 300 nm or more, and employ a three-layer laminate structure in which the silver alloy layer is sandwiched between the conductive metal oxide layers. In this case, a reflection electrode having a high visible light reflectance is achieved.

A material of the bank 94 may be organic resin such as acrylic resin, polyimide resin, or novolak phenol resin. Furthermore, an inorganic material such as silicon oxide or silicon oxynitride may be laminated on the bank 94.

A material of the flattening layer 96 may be acrylic resin, polyimide resin, benzocyclobutene resin, polyamide resin, or the like. Furthermore, a low dielectric constant material (low-k material) may be used.

In order to improve visual recognizability, any of the flattening layer 96, the sealing layer 109, and the substrate may have a light scattering function. Alternatively, a light-scattering layer may be formed above the substrate.

FIG. 13 is a cross-sectional view illustrating part of a display device according to the second embodiment of the present invention. Furthermore, FIG. 13 illustrates an example structure of a thin film transistor (TFT) having a top-gate structure used as the active element 68 connected to the pixel electrode. In FIG. 13, the first transparent substrate 1 and the sealing layer 109 are omitted.

The active element 68 includes the channel layer 65, the drain electrode 66 connected to one end of the channel layer 65 (a first end, a left end of the channel layer 65 in FIG. 13), a source electrode 64 connected to another end of the channel layer 65 (a second end, a right end of the channel layer 65 in FIG. 13), and the gate electrode 95 provided so as to face the channel layer 65 via the insulating layer 113. As will be described later, the channel layer 65 is made of an oxide semiconductor and is in contact with a gate insulating layer. The active element 68 drives the luminescent layer.

In FIG. 13, the channel layer 65, drain electrode 66, and source electrode 64 constituting the active element 68 are formed on the lower insulating layer 114, but the present invention is not limited to this structure. The active element 68 may be directly formed on the substrate without the lower insulating layer 114. Furthermore, a thin film transistor having a bottom-gate structure may be applied.

In the second embodiment, the source lines 67, the source electrodes 64 and the drain electrodes 66 are formed using part of the third conductive lines 23. The source lines 67, the source electrodes 64, the drain electrodes 66, and the third conductive lines 23 are located on the same layer.

The gate lines 69 and the gate electrodes 95 are formed using the fourth conductive lines 24. The gate lines 69, the gate electrodes 95 and the fourth conductive lines 24 are located on the same layer.

As described above, the third conductive lines 23 and the fourth conductive lines 24 are both triple-layered with a copper layer or a copper alloy layer being sandwiched between the conductive metal oxide layers.

The insulating layer 113 (second-substrate-side insulating layer) located under the lower part of the gate electrode 95 may be an insulating layer that is as wide as the gate electrode 95. In this case, the insulating layer 113 around the gate electrode 95 is removed, for example, by use of the gate electrode 95 as a mask to dry-etch the insulating layer 113. Thus, the insulating layer having the same width as the gate electrode 95 can be formed. In general, a technique of processing an insulating layer by dry etching using the gate electrode 95 as a mask is named self-alignment.

In the first embodiment, a composite oxide having an element ratio of In:Ga:Sb=1:1:1 is formed into a microcrystalline oxide semiconductor through low-temperature annealing at 280° C. to be used in the channel layer 65. A copper alloy having an element ratio of In:Ca:Zn=97:2.5:0.5 is used in the copper alloy layer in the first embodiment.

For example, a display device according to the embodiments described above can be put into practice in various ways. Examples of electronic devices to which the display device according to the above embodiments is applicable include mobile phones, portable game machines, portable information terminals, personal computers, electronic books, video cameras, digital still cameras, head mounted displays, navigation systems, sound reproduction devices (car audio systems, digital audio players, and the like), copiers, facsimiles, printers, multifunction printers, vending machines, automated teller machines (ATM), personal identification devices, and optical communication devices. The embodiments described above can be used in any combination.

The present invention, in one aspect, provides a display device and a display device substrate that achieves high resolution that allows touch input and pen input. The present invention, in another aspect, provides a display device and a display device substrate that achieves easy and contactless signal transmission or reception and power supply between a substrate with a touch sensing line unit and a substrate on which an active element for driving a display function layer, such as a liquid crystal layer and an organic EL layer, is disposed.

The display device according to a first embodiment of the present invention includes a first substrate having a first surface, a second substrate having a second surface facing the first surface, and a display function layer disposed between the first substrate and the second substrate. On the first surface of the first substrate, at least a black matrix provided with a rectangular effective display region and a frame region surrounding the effective display region, a first conductive line, a second conductive line, a plurality of first active elements, a first antenna unit, a second antenna unit, a first touch sensing line unit, and a second touch sensing line unit are provided. On the second surface of the second substrate, at least a third conductive line, a fourth conductive line, a plurality of second active elements for driving the display function layer, a gate line and a source line electrically connected to the second active elements, a third antenna unit, and a fourth antenna unit are provided. In the effective display region, the first touch sensing line unit includes a plurality of fifth conductive lines parallel to one another extending in a first direction, and the second touch sensing line unit includes a plurality of sixth conductive lines parallel to one another extending in a second direction that is perpendicular to the first direction. The fifth conductive lines are located on a layer in which the first conductive line is located, and have the same configuration as the first conductive line. The sixth conductive lines are located on a layer in which the second conductive line is located, and have the same configuration as the second conductive line. The first conductive line, the first antenna unit, the second antenna unit, and the first touch sensing line unit are formed of a triple-layered conductive layer in which a copper layer or a copper alloy layer is sandwiched between a first conductive metal oxide layer and a second conductive metal oxide layer in the thickness direction of the first substrate, and are located on the same layer. The second conductive line is laminated so as to cover the triple-layered conductive layer via a first-substrate-side insulating layer, and is formed of a triple-layered conductive layer in which a copper layer or a copper alloy layer is sandwiched between a third conductive metal oxide layer and a fourth conductive metal oxide layer. Each of the first antenna unit and the second antenna unit has one or more loop antennas, and a first connection pad is provided inside the loop antenna. The first connection pad is connected to part of the second conductive lines via a through-hole provided on the first-substrate-side insulating layer. The third conductive line, the third antenna unit, and the fourth antenna unit are formed of a triple-layered conductive layer in which a copper layer or a copper alloy layer are sandwiched between the fifth conductive metal oxide layer and the sixth conductive metal oxide layer in the thickness direction of the second substrate, and are located on the same layer. The fourth conductive line is laminated so as to cover the triple-layered conductive layer via a second-substrate-side insulating layer, and is formed of a triple-layered conductive layer in which a copper layer or a copper alloy layer is sandwiched between a seventh conductive metal oxide layer and an eighth conductive metal oxide layer. Each of the third antenna unit and the fourth antenna unit has one or more loop antennas, and a second connection pad is provided inside the loop antenna. The second connection pad is connected to part of the fourth conductive lines via a through-hole provided on the second-substrate-side insulating layer. In plan view seen from the first substrate toward the second substrate, the first antenna unit and the third antenna unit overlap with a positional accuracy within ±3 µm at a portion where the loop antenna is formed, and the second antenna unit and the fourth antenna unit overlap with a positional accuracy within ±3 µm at a portion where the loop antenna is formed. A first overlapping portion where the first antenna unit and the third antenna unit overlap each other has a function of transmitting or receiving a touch sensing signal. A second overlapping portion where the second antenna unit and the fourth antenna unit overlap each other has a function of receiving a power signal. In plan view seen from the first substrate toward the second substrate, the first overlapping portion and the second overlapping portion are disposed within the frame region. Part of the first conductive lines, part of the second conductive lines, and the plurality of first active elements constitute a circuit for controlling touch sensing.

The "circuit for controlling touch sensing" here refers to a circuit that applies a touch driving voltage to either one of the first touch sensing line unit and the second touch sensing line unit, and extracts a signal involved in touch detection from the other line unit, wherein the circuit is formed on a first surface of the first substrate.

In the display device according to the first embodiment of the present invention, each of the loop antennas of the first antenna unit and the second antenna unit may include a pair of loop antennas each of which is wound twice or more in a direction opposite to the other, and each of the loop antennas of the third antenna unit and the fourth antenna unit may include a pair of loop antennas each of which is wound twice or more in a direction opposite to the other.

The display device according to the first embodiment of the present invention may include a conductor pattern in which the first antenna unit and the second antenna unit are each partially enclosed, and a copper layer or a copper alloy layer is sandwiched between the first conductive metal oxide layer and the second conductive metal oxide layer.

The display device according to the first embodiment of the present invention may include a conductor pattern in which the third antenna unit and the fourth antenna unit are each partially enclosed, and a copper layer or a copper alloy layer is sandwiched between the third conductive metal oxide layer and the fourth conductive metal oxide layer.

In the display device according to the first embodiment of the present invention, the first active elements may have a channel layer constituted by an oxide semiconductor.

In the display device according to the first embodiment of the present invention, the oxide semiconductor may include indium oxide, gallium oxide, and additionally one or more selected from the group consisting of antimony oxide, bismuth oxide and zinc oxide.

In the display device according to the first embodiment of the present invention, the copper alloy layer may include a first element that forms a solid solution with copper and a second element that is less electronegative than copper and the first element; the first and second elements increase the specific resistance of the copper alloy layer by 1 $\mu\Omega$cm/at % or less when added to copper, and the copper alloy layer may have a specific resistance that in the range of 1.9 $\mu\Omega$cm to 6 $\mu\Omega$cm.

The display device substrate according to a second embodiment of the present invention includes, on the first surface of the first substrate, at least a black matrix provided with a rectangular effective display region and a frame region surrounding the effective display region, a first conductive line, a second conductive line, a plurality of first active elements, a first antenna unit, a second antenna unit, a first touch sensing line unit, and a second touch sensing line unit. In the effective display region, the first touch sensing line unit includes a plurality of fifth conductive lines parallel to one another extending in the first direction, the second touch sensing line unit includes a plurality of sixth conductive lines parallel to one another extending in a second direction that is perpendicular to the first direction, the fifth conductive lines are located on a layer in which the first conductive line is located, and have the same configuration as the first conductive line, the sixth conductive lines are located on a layer in which the second conductive line is located, and have the same configuration as the second conductive line, the first conductive line, the first antenna unit, the second antenna unit and the first touch sensing line unit are formed of a triple-layered conductive layer in which a copper layer or a copper alloy layer is sandwiched between the first conductive metal oxide layer and the second conductive metal oxide layer in the thickness direction of the display device substrate, and are located on the same layer, the second conductive line is laminated so as to cover the triple-layered conductive layer via an insulating layer, and is formed of a triple-layered conductive layer in which a copper layer or a copper alloy layer is sandwiched between a third conductive metal oxide layer and a fourth conductive metal oxide layer, each of the first antenna unit and the second antenna unit has one or more loop antennas, and a first connection pad is provided inside the loop antenna, the first connection pad is connected to part of the second conductive lines via a through-hole provided on the insulating layer, the first antenna unit and the second antenna unit are disposed within the frame region, and the effective display region is covered with a transparent resin layer on the first surface on which the first conductive line, the first antenna unit, the second conductive line, and the second antenna unit are formed.

The display device according to the second embodiment of the present invention may include a conductor pattern in which the first antenna unit and the second antenna unit are partially enclosed, and the copper layer or the copper alloy layer is sandwiched between the first conductive metal oxide layer and the second conductive metal oxide layer.

In the display device substrate according to the second embodiment of the present invention, each of the loop antennas of the first antenna unit and the second antenna unit may include a pair of loop antennas each of which is wound twice or more in a direction opposite to the other.

In the display device substrate according to the second embodiment of the present invention, the first touch sensing line unit may include a plurality of first touch sensing lines extending in the first direction, and the second touch sensing line unit may include a plurality of second touch sensing lines extending in the second direction.

An aspect of the present invention can carry out contactless signal (touch sensing signal and power signal) transmission or reception via an antenna unit between a first substrate provided with a touch sensing line unit equipped with a large number of conductive lines (touch sensing lines) and a second substrate. In addition, the aspect eliminates the need for a hard technique, such as using gold beads and conductive particles, for electrical connection of the large number of conductive lines formed on the first substrate to the second substrate.

Preferred embodiments of the present invention have so far been described. These embodiments are, however, only examples and should not be taken as limiting the invention. Additions, omissions, substitutions, and other changes may be made without departing from the scope of the invention. Accordingly, the invention should not be construed as being limited by the foregoing description, but as being limited by the claims.

REFERENCE SIGNS LIST

1 . . . First transparent substrate
2 . . . Second transparent substrate (substrate)
3 . . . Black matrix
4 . . . Liquid crystal layer
7 . . . First conductive metal oxide layer
8 . . . Copper alloy layer
9 . . . Second conductive metal oxide layer
10 . . . Pixel aperture
11 . . . First antenna unit
12 . . . Second antenna unit
13 . . . Third antenna unit
14 . . . Fourth antenna unit
15 . . . Power receiver
16 . . . Power supply controller
17 . . . Touch driving controller
18 . . . Touch driving switching circuit
19 . . . Touch detection switching circuit
20 . . . Touch signal transmission or reception controller
21 . . . First conductive line
22 . . . Second conductive line
23 . . . Third conductive line
24 . . . Fourth conductive line
25A, 25B . . . Conductor pattern 26 . . . Source signal switching circuit
27 . . . Gate signal switching circuit
28 . . . Power transmission unit
29 . . . Signal transceiver
30 . . . Detection and AD conversion unit
31, 53, 67 . . . Source line
32, 58, 64 . . . Source electrode
33 . . . Gate line (gate electrode)
34, 95, 54 . . . Gate electrode
35, 59, 65 . . . Channel layer
37, 57, 66 . . . Drain electrode
38 . . . First active element
41, 114 . . . Lower insulating layer
42 . . . First-substrate-side insulating layer (gate insulating layer)
43, 112 . . . Upper insulating layers
44 Second insulating layer (gate insulating layer)
45, 46 . . . Insulating layer
48 . . . Second active element
49 . . . Pixel electrode
51 . . . First overlapping portion
52 . . . Second overlapping portion
55 . . . Fifth conductive line
56 . . . Sixth conductive line
60, 61 . . . First connection pad
62, 63 . . . Second connection pad
68 . . . Active element (second active element)
69 . . . Gate line
71 . . . Effective display region
72 . . . Frame region
87 . . . Upper electrode
88 . . . Lower electrode
90, 93 . . . Contact hole
91 . . . Hole injection layer
92 . . . Luminescent layer
94 . . . Bank
96 . . . Flattening layer
97 . . . Transparent resin layer
100 . . . Display device substrate
101 . . . First surface
109 . . . Sealing layer
110 . . . Display unit
113 . . . Insulating layer (second-substrate-side insulating layer)
120 . . . Control unit
121 . . . Video signal controller
122 . . . Touch sensing controller
123 . . . System controller
164, 165 . . . Loop antenna
166 . . . Center
200, 300 . . . Array substrate
201 . . . Second surface
DSP1, DSP2 . . . Display device Obviously, numerous modifications and variations of the present invention are possible in light of the above teachings. It is therefore to be understood that within the scope of the appended claims, the invention may be practiced otherwise than as specifically described herein.

What is claimed is:
1. A display device, comprising:
a first substrate having a first surface;
a second substrate having a second surface facing the first surface;
a display function layer formed between the first substrate and the second substrate;
a black matrix formed on the first surface and having an effective display region and a frame region surrounding the effective display region;
a first antenna unit formed in the frame region for touch sensing;
a second antenna unit formed in the frame region for power;
a plurality of first conductive lines formed in the effective display region such that a part of the first conductive lines forms a first touch sensing line unit including a plurality of fifth conductive lines parallel to one another, the first conductive lines, the first and second antenna units, and the first touch sensing line unit being located on the same layer and each comprising a triple-layered conductive layer including a copper or copper alloy layer sandwiched between conductive metal oxide layers in a thickness direction of the first substrate;
a plurality of second conductive lines formed perpendicularly to the first conductive lines such that a part of the second conductive lines forms a second touch sensing line unit including a plurality of sixth conductive lines parallel to one another, the second conductive lines each covering the triple-layered conductive layer forming the first conductive line via a first-substrate-side insulating layer, and comprising a triple-layered conductive layer including a copper or copper alloy layer sandwiched between conductive metal oxide layers;
a plurality of first active elements formed in the frame region such that the first active elements, the fifth conductive lines, and the sixth conductive lines form in a circuit for controlling touch sensing;
a third antenna unit formed on the second surface for touch sensing;
a fourth antenna unit formed on the second surface for power;
a plurality of second active elements for driving the display function layer;
a plurality of third conductive lines formed on the second surface, the third conductive lines and the third and fourth antenna units being located on the same layer and each comprising a triple-layered conductive layer including a copper or copper alloy layer sandwiched between conductive metal oxide layers in a thickness direction of the second substrate; and
a plurality of fourth conductive lines formed perpendicularly to the third conductive lines, the fourth conductive lines each covering the triple-layered conductive layer forming the third conductive lines via a second-substrate-side insulating layer, and comprising a triple-layered conductive layer including a copper or copper alloy layer sandwiched between conductive metal oxide layers,
wherein each of the first and second antenna units has at least one loop antenna including a connection pad connected to a part of the second conductive lines via a through-hole formed in the first-substrate-side insulating layer,
each of the third and fourth antenna units has at least one loop antenna including a connection pad connected to a part of the fourth conductive lines via a through-hole formed in the second-substrate-side insulating layer, and
in a plan view from the first substrate toward the second substrate, the first and third antenna units overlap for transmitting or receiving a touch sensing signal, with a positional accuracy within ±3 µm in a portion where the loop antenna is formed, and the second and fourth antenna units overlap for receiving a power signal, with a positional accuracy within ±3 µm in a portion where the loop antenna is formed.

2. The display device according to claim 1, wherein each of the loop antennas of the first and second antenna units includes a pair of loop antennas each of which is wound twice or more in a direction opposite to the other, and each of the loop antennas of the third and fourth antenna units includes a pair of loop antennas wound twice or more in a direction opposite to the other.

3. The display device according to claim 1, wherein the first and second antenna units are partially enclosed by a conductor pattern including a copper or copper alloy layer sandwiched between conductive metal oxide layers.

4. The display device according to claim I, wherein the third and fourth antenna units are partially enclosed by a conductor pattern including a copper or copper alloy layer sandwiched between conductive metal oxide layers.

5. The display device according to claim I, wherein the first active elements each have a channel layer comprising an oxide semiconductor.

6. The display device according to claim 5, wherein the oxide semiconductor includes indium oxide and gallium oxide, and further includes at least one selected from the group consisting of antimony oxide, bismuth oxide, and zinc oxide.

7. The display device according to claim 1, wherein each of the triple-layered conductive layers has a copper alloy layer including a first element that forms a solid solution with copper and a second element that is less electronegative than copper and the first element, the first and second elements increase a specific resistance of the copper alloy layer by 1 µΩcm/at% or less when added to copper, and the copper alloy layer has a specific resistance of 1.9 µΩcm to 6 µΩcm.

8. A display device substrate, comprising:
a substrate having a first surface;
a black matrix formed on the first surface and having an effective display region and a frame region surrounding the effective display region;
a first antenna unit formed in the frame region;
a second antenna unit formed in the frame region;
a plurality of first conductive lines formed in the effective display region such that a part of the first conductive lines forms a first touch sensing line unit including a plurality of fifth conductive lines parallel to one another, the first conductive lines, the first and second antenna units, and the first touch sensing line unit being located on the same layer and each comprising a triple-layered conductive layer including a copper or copper alloy layer sandwiched between conductive metal oxide layers in a thickness direction of the first substrate;
a plurality of second conductive lines formed perpendicularly to the first conductive lines such that a part of the second conductive lines forms a second touch sensing line unit including a plurality of sixth conductive lines parallel to one another, the second conductive lines each covering the triple-layered conductive layer forming the first conductive line via an insulating layer, and comprising a triple-layered conductive layer including a copper or copper alloy layer sandwiched between conductive metal oxide layers; and
a transparent resin layer covering the effective display region on the first surface,
wherein each of the first and second antenna units has at least one loop antenna including a connection pad connected to a part of the second conductive lines via a through-hole formed in the insulating layer.

9. The display device substrate according to claim 8, wherein the first and second antenna units are partially enclosed by a conductor pattern.

10. The display device substrate according to claim 8, wherein each of the loop antennas of the first and second antenna units includes a pair of loop antennas each of which is wound twice or more in a direction opposite to the other.

* * * * *